(12) United States Patent
Isogai et al.

(10) Patent No.: US 11,996,445 B2
(45) Date of Patent: May 28, 2024

(54) CARBON NANOTUBE COMPOSITE, DISPERSION LIQUID USING SAME, SEMICONDUCTOR DEVICE, METHOD FOR PRODUCING SEMICONDUCTOR DEVICE, AND WIRELESS COMMUNICATION DEVICE AND MERCHANDISE TAG EACH USING SEMICONDUCTOR DEVICE

(71) Applicant: Toray Industries, Inc., Tokyo (JP)

(72) Inventors: Kazuki Isogai, Otsu (JP); Seiichiro Murase, Otsu (JP); Ryuichi Tanaka, Otsu (JP); Hidekazu Nishino, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 735 days.

(21) Appl. No.: 17/273,831

(22) PCT Filed: Sep. 17, 2019

(86) PCT No.: PCT/JP2019/036330
§ 371 (c)(1),
(2) Date: Mar. 5, 2021

(87) PCT Pub. No.: WO2020/066741
PCT Pub. Date: Apr. 2, 2020

(65) Prior Publication Data
US 2021/0328011 A1    Oct. 21, 2021

(30) Foreign Application Priority Data
Sep. 25, 2018   (JP) .................. 2018-178711

(51) Int. Cl.
*H01L 29/06* (2006.01)
*B82Y 30/00* (2011.01)
(Continued)

(52) U.S. Cl.
CPC ........ *H01L 29/0669* (2013.01); *C01B 32/174* (2017.08); *H01L 29/786* (2013.01); *H10K 10/488* (2023.02); *B82Y 30/00* (2013.01)

(58) Field of Classification Search
CPC . H01L 29/0669; H01L 29/786; C01B 32/174; C01B 32/168; H10K 10/488;
(Continued)

(56) References Cited

U.S. PATENT DOCUMENTS 8,530,889 B2    9/2013  Jo et al.
2010/0102299 A1*  4/2010  Murase ............... H10K 10/488
                                                      977/932
(Continued)

FOREIGN PATENT DOCUMENTS

JP    2004002156 A    1/2004
JP    2005089738 A    4/2005
(Continued)

OTHER PUBLICATIONS

Kwon, et al., Carbon Nanotube Web with Carboxylated Polythiophene "Assist" for High-Performance Battery Electrodes, ACS Nano 2018; 12: 3126-3139 (Year: 2018).*
(Continued)

*Primary Examiner* — Daniel C. McCracken
(74) *Attorney, Agent, or Firm* — BUCHANAN INGERSOLL & ROONEY PC

(57) ABSTRACT

A carbon nanotube composite is described that can be accurately applied to a desired position by inkjet and a dispersion liquid using the same, where a main object is a carbon nanotube composite in which a conjugated polymer is attached to at least a part of the surface of a carbon nanotube, the conjugated polymer having a side chain represented by general formula (1):
(Continued)

[Chemical formula 1]

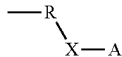

(1)

wherein R, X and A are defined as described.

10 Claims, 2 Drawing Sheets

(51) Int. Cl.
*C01B 32/174* (2017.01)
*H01L 29/786* (2006.01)
*H10K 10/46* (2023.01)

(58) Field of Classification Search
CPC .. H10K 85/113; H10K 85/151; H10K 85/221; H10K 10/00; B82Y 30/00
See application file for complete search history.

(56) References Cited

U.S. PATENT DOCUMENTS

2016/0155948 A1 6/2016 Murase et al.
2019/0101507 A1 4/2019 Isogai et al.

FOREIGN PATENT DOCUMENTS

| JP | 2006248888 A | 9/2006 |
| JP | 2007076998 A | 3/2007 |
| JP | 2009033126 A | 2/2009 |
| JP | 2010018696 A | 1/2010 |
| JP | 2010163570 A | 7/2010 |
| TW | 201505961 A | 2/2015 |
| WO | 2009139339 A1 | 11/2009 |
| WO | 2017183534 A1 | 10/2017 |

OTHER PUBLICATIONS

English Translation of the Written Opinion of the International Searching Authority in PCT/JP2019/036330 dated Dec. 3, 2019 (Year: 2019).*
International Search Report and Written Opinion for International Application No. PCT/JP2019/036330, dated Dec. 3, 2019, 5 pages.
Lixiang, L.I., "The Effect of Carbonyl, Carboxyl and Hydroxyl Groups on the Capacitance of Carbon Nanotubes", Jun. 2011, vol. 26(3), pp. 224-228, New Carbon Materials.
Indian Examination Report for Indian Application No. 202147010832, dated Dec. 27, 2022 with translation, 5 pages.
Chen, B., et al., "Highly Uniform Carbon Nanotube Field-Effect Transistors and Medium Scale Integrated Circuits," Jul. 26, 2016, vol. 16, pp. 5120-5128, Nano Letters, American Chemical Society.
Fedors, R.F., "A Method for Estimating Both the Solubility Parameters and Molar Volumes of Liquids," Feb. 1974, vol. 14(2), pp. 147-154, Polymer Engineering and Science.
Ji, D., et al., "Selective Dispersion of High-Purity Semiconducting Carbon Nanotubes Using Indacenodithiophene-Based Conjugated Polymer," Jan. 17, 2018, vol. 112, 033103-1-4, Applied Physics Letters.

* cited by examiner

CARBON NANOTUBE COMPOSITE, DISPERSION LIQUID USING SAME, SEMICONDUCTOR DEVICE, METHOD FOR PRODUCING SEMICONDUCTOR DEVICE, AND WIRELESS COMMUNICATION DEVICE AND MERCHANDISE TAG EACH USING SEMICONDUCTOR DEVICE

CROSS REFERENCE TO RELATED APPLICATIONS

This is the U.S. National Phase application of PCT/JP2019/036330, filed Sep. 17, 2019, which claims priority to Japanese Patent Application No. 2018-178711, filed Sep. 25, 2018, the disclosures of these applications being incorporated herein by reference in their entireties for all purposes.

FIELD OF THE INVENTION

The present invention relates to a carbon nanotube composite, a dispersion liquid using the same, a semiconductor device and a method for producing the same, and a wireless communication device and a merchandise tag each using the semiconductor device.

BACKGROUND OF THE INVENTION

In recent years, wireless communication systems that use an RFID (Radio Frequency IDentification) technology have been advanced as non-contact tags. In an RFID system, wireless communication is performed between a wireless transceiver called a reader/writer and an RFID tag.

RFID tags are expected to be used in various applications such as logistics management, merchandise management, and shoplifting prevention, and have been introduced for a part of applications such as IC cards such as transport cards and merchandise tags. The RFID tag has an IC chip and an antenna. The antenna installed in the RFID tag receives carrier waves transmitted from the reader/writer, and a driving circuit in the IC chip operates.

RFID tags are expected to be used for various products. In order to do that, it is necessary to reduce manufacturing cost of RFID tags. Therefore, in the RFID tag manufacturing process, it has been considered to break away from the processes that use vacuum or high temperatures and to use a flexible and inexpensive process using coating and printing techniques.

For example, in a transistor in a driving circuit in an IC chip, it is considered to use an organic semiconductor to which an inkjet technique or a spin coating technique can be applied as a material for a semiconductor layer. Therefore, field-effect transistors (hereinafter referred to as FETs) using carbon nanotubes (CNTs) and organic semiconductors, in place of conventional inorganic semiconductors, have been actively studied (for example, see Patent Document 1, Non-Patent Documents 1 and 2).

PATENT DOCUMENT

Patent Document 1: WO 2009/139339 A

NON-PATENT DOCUMENTS

Non-Patent Document 1: Nano Letters. 16, p. 5120-5128 (2016)
Non-Patent Document 2: Applied Physics Letters. 112, p. 033103 (2018)

SUMMARY OF THE INVENTION

Transistors are arranged in each driving circuit, and a technique for forming a semiconductor layer at each transistor position is required. As a candidate technique, there is a technique for forming a semiconductor layer by applying a solution of a semiconductor layer material to a desired position by inkjet and drying the solution. An inkjet method can perform patterning of the coating material with high accuracy and high speed.

However, the carbon nanotube dispersion liquids prepared by the techniques described in Patent Document 1 and Non-Patent Documents 1 and 2 had poor coating properties by inkjet, caused a phenomenon such as generation of satellites (spattering of an inkjet coating liquid) and insufficient coating position accuracy, and had a problem that variation in transistor characteristics becomes large.

The inventors found that such a phenomenon was due to use of a low-viscosity solvent such as toluene (viscosity 1.5 cP) or N-methylpyrrolidone (viscosity 1.9 cP).

Generally, there are known attempts to improve coatability by adding various additives as a means for improving the coatability. However, in the field of semiconductor materials, such additives are almost always unnecessary in light of semiconductor properties, especially conductivity. For example, when a thickener was added in order to obtain a suitable viscosity range, in the case of forming a semiconductor device, there had a problem that conductivity was inhibited by a thickener and device characteristics were insufficient. Further, even if an attempt was made to change a solvent type to a solvent having a viscosity directly applicable to the inkjet method, a conventional CNT composite could not be well dispersed in a solvent having such a viscosity.

Therefore, an object of the present invention is to provide a carbon nanotube composite that can be accurately applied to a desired position by inkjet and a dispersion liquid using the same.

In order to solve the above problems, the present invention has following configurations.

More specifically, the present invention is a carbon nanotube composite in which a conjugated polymer is attached to at least a part of the surface of a carbon nanotube, the conjugated polymer having a side chain represented by general formula (1):

[Chemical formula 1]

(1)

wherein R represents an alkylene group or a cycloalkylene group, X represents a single bond, an alkenylene group, an alkynylene group, an arylene group or a heteroarylene group, and A represents an alkylcarbonyl group, an arylcarbonyl group, a heteroarylcarbonyl group, an alkoxycarbonyl group, an aryloxycarbonyl group, a heteroaryloxycarbonyl group, an alkylcarbonyloxy group, an arylcarbonyloxy group, or a heteroarylcarbonyloxy group.

According to the present invention, it is possible to obtain a carbon nanotube composite that can be accurately applied to a desired position by inkjet and a dispersion liquid using the same. Further, it is possible to provide a semiconductor device, a wireless communication device, and a merchandise tag using the carbon nanotube composite and a dispersion liquid each using the same.

DETAILED DESCRIPTION OF EMBODIMENTS OF THE INVENTION

Figure 1:
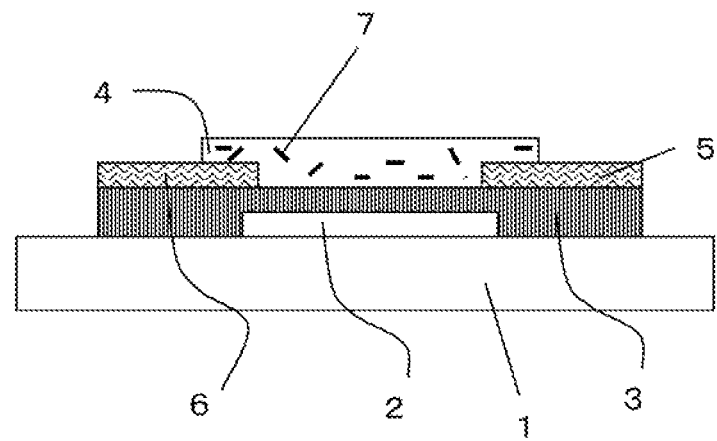
FIG. 1 is a schematic cross-sectional view showing a semiconductor device which is one of the embodiments of the present invention.

Hereinafter, preferred embodiments of a carbon nanotube composite, a dispersion liquid using the same, a semiconductor device and a method for producing the same, and a wireless communication device and a merchandise tag each using the semiconductor device according to the present invention will be described. However, the present invention is not limited to the following embodiments, and can be implemented with various modifications according to purposes and applications.

<Carbon Nanotube Composite>

In a carbon nanotube (hereinafter referred to as CNT) composite, a conjugated polymer having a side chain represented by general formula (1) described later is attached to at least a part of the surface of CNTs.

Attaching the conjugated polymer to at least a part of the surface of CNTs makes it possible to uniformly disperse the CNTs in a solution without impairing high electrical characteristics of CNTs. By using a solution in which CNTs are uniformly dispersed, it is possible to form a uniformly dispersed CNT film by a coating method. Due to this, it is possible to realize high semiconductor characteristics.

A state in which a conjugated polymer attaches to at least a part of the surface of CNTs means a state in which a part of or the entire surface of CNTs is coated with the conjugated polymer. It is presumed that the conjugated polymer can coat CNTs because interaction occurs due to an overlap of π-electron clouds derived from both conjugated structures.

Whether or not CNTs are coated with the conjugated polymer can be determined from a reflected color of the CNTs. A reflected color of coated CNTs is different from a reflected color of uncoated CNTs and close to a reflected color of the conjugated polymer. Quantitatively, the presence of deposits on the CNTs can be confirmed and a weight ratio of the CNTs to the deposits can be measured by elemental analysis such as X-ray photoelectron spectroscopy (XPS). The conjugated polymer preferably coats 5% or more and 90% or less of the surface of CNTs, more preferably 70% or less, and further preferably 50% or less.

Examples of a method for attaching the conjugated polymer to the CNTs include: (I) a method of adding and mixing the CNTs to and with the melted conjugated polymer; (II) a method of dissolving the conjugated polymer in a solvent, and adding and mixing the CNTs to and with the solvent; (III) a method of adding and mixing the conjugated polymer to and with the CNTs dispersed in a solvent in advance with ultrasonic waves or the like; (IV) a method of putting the conjugated polymer and the CNTs in a solvent, and irradiating the mixed system with ultrasonic waves for mixing the system, and the like. In the present invention, any method may be used, and a plurality of methods may be combined.

(CNT)

As CNTs, any of single-walled CNTs in which a single carbon film (graphene sheet) is wound cylindrically, double-walled CNTs in which two graphene sheets are wound concentrically, and multi-walled CNTs in which a plurality of graphene sheets are wound concentrically may be used. In order to obtain high semiconductor characteristics, it is preferable to use single-walled CNTs. CNTs can be obtained by an arc discharge method, a chemical vapor deposition method (CVD method), a laser ablation method, or the like.

In addition, it is more preferable that CNTs include 80% by weight or more of semiconducting CNTs. CNTs include further preferably 90% by weight or more of semiconducting CNTs, and particularly preferably 95% by weight or more of semiconducting CNTs. As a method for obtaining CNTs including 80% by weight or more of semiconducting CNTs, a known method can be used. Examples thereof include a method in which ultracentrifugation is performed in the presence of a density gradient agent, a method in which a specific compound is selectively attached to the surface of semiconducting or metallic CNTs, followed by separation utilizing a difference in solubility, and a method in which separation is performed by electrophoresis or the like utilizing a difference in electrical properties. Examples of a method for measuring the semiconducting CNT content in CNTs include a method of calculation from an absorption area ratio of a visible-near infrared absorption spectrum, a method of calculation from a Raman spectrum intensity ratio, and the like.

In the present invention, when CNTs are used for a semiconductor layer of a semiconductor device, it is preferable that length of CNTs is shorter than distance between a source electrode and a drain electrode (hereinafter, "distance between electrodes"). Average length of CNTs depends on the distance between electrodes, but is preferably 2 μm or less, and more preferably 1 μm or less. Other methods for shortening the CNTs include an acid treatment, a freeze pulverization treatment, and the like.

The average length of CNTs refers to the average value of lengths of 20 CNTs randomly picked up. A method for measuring the average length of CNTs is, for example, a method in which 20 CNTs are randomly picked up from an image obtained by an atomic force microscope, a scanning electron microscope, a transmission electron microscope or the like, and their lengths are averaged.

Commercially available CNTs have a distribution in length and may contain CNTs longer than the distance between electrodes. Therefore, it is preferable to add a step of making CNTs shorter than the distance between electrodes. For example, a method is effective in which the CNTs are cut into short fibers by an acid treatment with nitric acid, sulfuric acid or the like, by an ultrasonic treatment, by a freeze pulverization method, or the like. In addition, it is further preferable to also use separation through a filter, in terms of improving purity of CNTs.

Moreover, diameter of CNTs is not particularly limited, but it is preferably 1 nm or more and 100 nm or less, and more preferably 50 nm or less as an upper limit.

In the present invention, it is preferable to provide a step of uniformly dispersing CNTs in a solvent and filtering the dispersion liquid through a filter. Obtaining CNTs smaller than the filter pore size from the filtrate makes it possible to efficiently obtain CNTs shorter than the distance between electrodes. In this case, a membrane filter is preferably used as a filter. The pore size of the filter used for filtration only has to be smaller than the distance between electrodes, and is preferably 0.5 to 10 µm.

(Conjugated Polymer)

In the present invention, the conjugated polymer refers to a compound in which a repeating unit has a conjugated structure and a polymerization degree is 2 or more. Examples of the conjugated polymer include a polythiophene polymer, a polypyrrole polymer, a polyaniline polymer, a polyacetylene polymer, a poly-p-phenylene polymer, a poly-p-phenylene vinylene polymer, and the like, but are not particularly limited. As the polymer, a polymer in which single monomer units are arranged is preferably used, but a polymer obtained by block copolymerization, random copolymerization or graft polymerization of different monomer units is also used.

Among the polymers, in the present invention, a conjugated polymer containing a fluorene unit or a thiophene unit in the repeating unit is preferable from the viewpoint of easy attachment to CNTs and easy formation of a CNT composite. Further, one containing a fused heteroaryl unit having a nitrogen-containing double bond in the ring in the repeating unit is more preferable.

Examples of the fused heteroaryl unit having a nitrogen-containing double bond in the ring include units of thienopyrrole, pyrrolothiazole, pyrrolopyridazine, benzimidazole, benzotriazole, benzoxazole, benzothiazole, benzothiadiazole, quinoline, quinoxaline, benzotriazine, thienooxazole, thienopyridine, thienothiazine, thienopyrazine, and the like. Among them, particularly, a benzothiadiazole unit or a quinoxaline unit is preferable. By having these units, adhesion between CNTs and conjugated polymer is increased, and the CNTs can be better dispersed.

In the present invention, the conjugated polymer has a side chain represented by the general formula (1).

[Chemical formula 2]

(1)

wherein R represents an alkylene group or a cycloalkylene group, X represents a single bond, an alkenylene group, an alkynylene group, an arylene group or a heteroarylene group, and A represents an alkylcarbonyl group, an arylcarbonyl group, a heteroarylcarbonyl group, an alkoxycarbonyl group, an aryloxycarbonyl group, a heteroaryloxycarbonyl group, an alkylcarbonyloxy group, an arylcarbonyloxy group, or a heteroarylcarbonyloxy group.

The CNT composite to which the conjugated polymer having a side chain represented by the general formula (1) is attached has good dispersibility in a solvent. In particular, the CNT composite well disperses in a solvent having a viscosity of about 3 to 20 cP, which is suitable for inkjet coating. It is presumed that this is because the side chain represented by the general formula (1) changed an aspect of a molecular motion of the conjugated polymer in the solvent and improved compatibility with a solvent having a suitable viscosity.

From the viewpoint of further enhancing the above effect, A is preferably an alkylcarbonyl group, an alkoxycarbonyl group or an alkylcarbonyloxy group, and further preferably an alkoxycarbonyl group.

The alkylene group represents a divalent (two bonding sites) saturated aliphatic hydrocarbon group, and examples thereof include an ethylene group, a propylene group, a butylene group, a hexylene group, and the like. The alkylene group may or may not have a substituent. In addition, the carbon number of the alkylene group is not particularly limited, but is preferably 1 or more and 20 or less, and more preferably 1 or more and 8 or less, in terms of easy availability and cost.

The cycloalkylene group represents a divalent saturated alicyclic hydrocarbon group, and examples thereof include a cyclopropylene group, a cyclobutylene group, a cyclopentalene group, a cyclohexylene group, and the like. The cycloalkylene group may or may not have a substituent. In addition, the carbon number of the cycloalkylene group is not particularly limited, but is preferably 3 or more and 20 or less, and more preferably 3 or more and 8 or less, in terms of easy availability and cost.

The alkenylene group represents a divalent unsaturated aliphatic hydrocarbon group, and examples thereof include an ethenylene group, a propenylene group, a butenylene group, a hexenylene group, and the like. The alkenylene group may or may not have a substituent. In addition, the carbon number of the alkenylene group is not particularly limited, but is preferably 2 or more and 20 or less, and more preferably 2 or more and 8 or less, in terms of easy availability and cost.

The alkynylene group represents a divalent unsaturated aliphatic hydrocarbon group, and examples thereof include an ethynylene group, a propynylene group, a butynylene group, a hexynylene group, and the like. The alkynylene group may or may not have a substituent. In addition, the carbon number of the alkynylene group is not particularly limited, but is preferably 2 or more and 20 or less, and more preferably 2 or more and 8 or less, in terms of easy availability and cost.

The arylene group represents a divalent aromatic hydrocarbon group, and examples thereof include a phenylene group, a naphthylene group, a biphenylene group, a phenanthrylene group, an anthrylene group, a terphenylene group, a pyrenylene group, a fluorenylene group, a perylenylene group, and the like. The arylene group may be unsubstituted or substituted. The carbon number of the arylene group is not particularly limited, but is preferably in a range of 6 or more and 40 or less.

The heteroarylene group represents a divalent heteroaromatic ring group, and examples thereof include divalent groups derived from a heteroaromatic ring, such as benzofuran, dibenzofuran, benzothiophene, dibenzothiophene, benzodithiophene, benzosilole and dibenzosilole, and the like, in addition to a pyridylene group, a pyrazylene group, a quinolinylene group, an isoquinolinylene group, a quinoxalylene group, an acridinylene group, an indolylene group, a carbazolylene group, and the like. The heteroarylene group may be unsubstituted or substituted. The carbon number of the heteroarylene group is not particularly limited, but is preferably in a range of 2 or more and 30 or less.

The alkylcarbonyl group represents a functional group in which one of carbonyl bonds is substituted with an aliphatic hydrocarbon group, for example, an acetyl group, or a hexanoyl group, and the like. The alkylcarbonyl group may or may not have a substituent. The carbon number of the alkylcarbonyl group is not particularly limited, but is preferably in a range of 2 or more and 20 or less.

The arylcarbonyl group represents a functional group in which one of carbonyl bonds is substituted with an aromatic hydrocarbon group, for example, a benzoyl group and the like. The arylcarbonyl group may or may not have a substituent. The carbon number of the arylcarbonyl group is not particularly limited, but is preferably in a range of 6 or more and 40 or less.

The heteroarylcarbonyl group represents a functional group in which one of carbonyl bonds is substituted with a heteroaromatic ring group. The heteroarylcarbonyl group may or may not have a substituent. The carbon number of the heteroarylcarbonyl group is not particularly limited, but is preferably in a range of 2 or more and 30 or less.

The alkoxycarbonyl group represents a functional group in which one of carbonyl bonds is substituted with an alkoxy group, for example, a methoxycarbonyl group and the like. The alkoxycarbonyl group may or may not have a substituent. The carbon number of the alkoxycarbonyl group is not particularly limited, but is preferably in a range of 2 or more and 20 or less.

The aryloxycarbonyl group represents, for example, a functional group in which one of carbonyl bonds is substituted with an aryloxy group, for example, such as a phenoxycarbonyl group. The aryloxycarbonyl group may or may not have a substituent. The carbon number of the aryloxycarbonyl group is not particularly limited, but is preferably in a range of 6 or more and 40 or less.

The heteroaryloxycarbonyl group represents a functional group in which one of carbonyl bonds is substituted with a heteroaryloxy group. The heteroaryloxycarbonyl group may or may not have a substituent. The carbon number of the heteroaryloxycarbonyl group is not particularly limited, but is preferably in a range of 2 or more and 30 or less.

The alkylcarbonyloxy group represents a functional group in which one of ether bonds is substituted with an alkylcarbonyl group, for example, an acetoxy group and the like. The alkylcarbonyloxy group may or may not have a substituent. The carbon number of the alkylcarbonyloxy group is not particularly limited, but is preferably in a range of 2 or more and 20 or less.

The arylcarbonyloxy group represents a functional group in which one of ether bonds is substituted with an arylcarbonyl group, for example, a benzoyloxy group and the like. The arylcarbonyloxy group may or may not have a substituent. The carbon number of the arylcarbonyloxy group is not particularly limited, but is preferably in a range of 6 or more and 40 or less.

The heteroarylcarbonyloxy group represents a functional group in which one of ether bonds is substituted with a heteroarylcarbonyl group. The heteroarylcarbonyloxy group may or may not have a substituent. The carbon number of the arylcarbonyloxy group is not particularly limited, but is preferably in a range of 2 or more and 30 or less.

The alkyl group represents a saturated aliphatic hydrocarbon group such as a methyl group, an ethyl group, an n-propyl group, an isopropyl group, an n-butyl group, a sec-butyl group, a tert-butyl group, and the like. The alkyl group may or may not have a substituent. In addition, the carbon number of the alkyl group is not particularly limited, but is preferably 1 or more and 20 or less, and more preferably 1 or more and 8 or less, in terms of easy availability and cost.

Examples of the aromatic hydrocarbon group include a phenyl group, a naphthyl group, a biphenyl group, an anthracenyl group, a phenanthryl group, a terphenyl group, a pyrenyl group, a fluorenyl group, and the like. The aromatic hydrocarbon group may or may not have a substituent. The carbon number of the aromatic hydrocarbon group is not particularly limited, but is preferably in a range of 6 or more and 40 or less.

The heteroaromatic ring group represents an aromatic group having one or more atoms other than carbon in the ring, for example, a furanyl group, a thiophenyl group, a benzofuranyl group, a dibenzofuranyl group, a pyridyl group, a quinolinyl group, a benzosilole group, and a dibenzosilole group. The heteroaromatic ring group may or may not have a substituent. The carbon number of the heteroaromatic ring group is not particularly limited, but is preferably in a range of 2 or more and 30 or less.

The alkoxy group represents a functional group in which one of ether bonds is substituted with an alkyl group, for example, a methoxy group, an ethoxy group a propoxy group, and the like. The alkoxy group may or may not have a substituent. The carbon number of the alkoxy group is not particularly limited, but is preferably in a range of 1 or more and 20 or less.

The aryloxy group represents a functional group in which one of ether bonds is substituted with an aromatic hydrocarbon group, for example, a phenoxy group, a naphthoxy group, and the like. The aryloxy group may or may not have a substituent. The carbon number of the aryloxy group is not particularly limited, but is preferably in a range of 6 or more and 40 or less.

The heteroaryloxy group represents a functional group in which one of ether bonds is substituted with a heteroaromatic ring group. The heteroaryloxy group may or may not have a substituent. The carbon number of the heteroaryloxy group is not particularly limited, but is preferably in a range of 2 or more and 30 or less.

Specific examples of the conjugated polymer preferably used in the present invention include those having the following structure. However, it is not limited to these.

[Chemical formula 3]

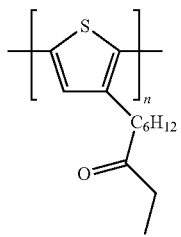

[1]

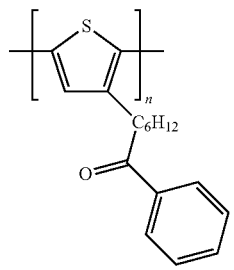

[2]

-continued
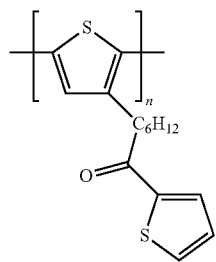 [3]
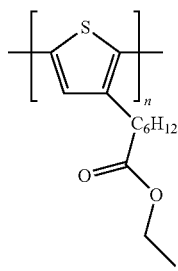 [4]
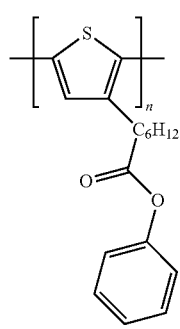 [5]
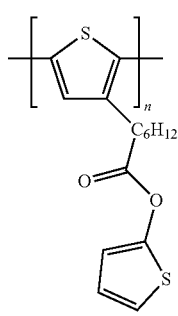 [6]
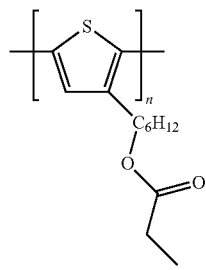 [7]
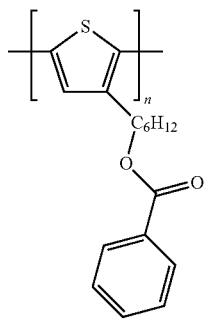 [8]
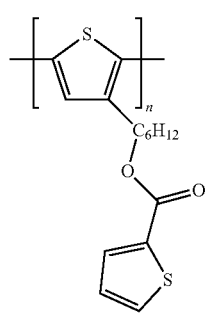 [9]
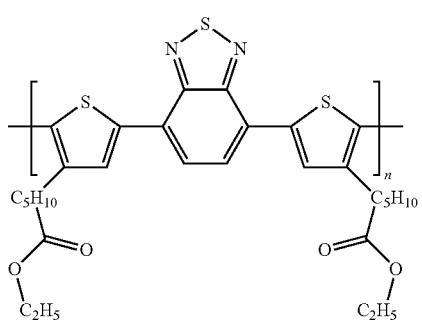 [10]
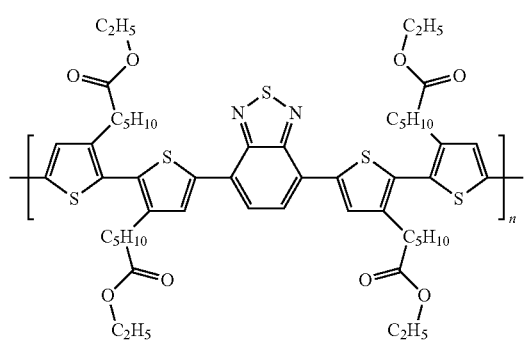 [11]
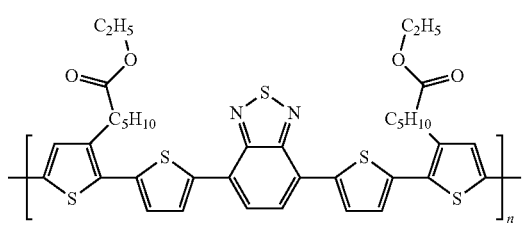 [12]

-continued
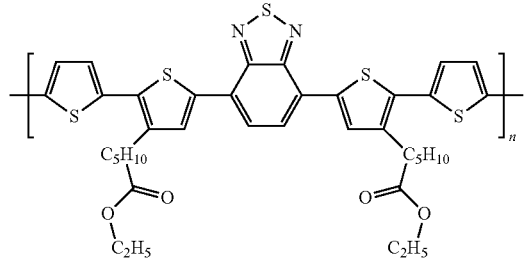
[13]
[Chemical formula 4]
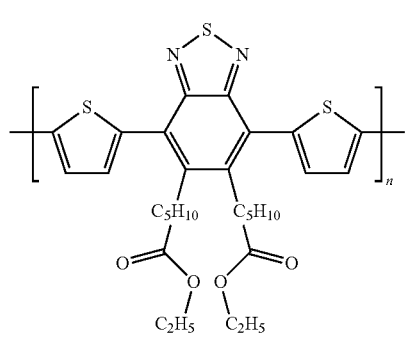
[14]
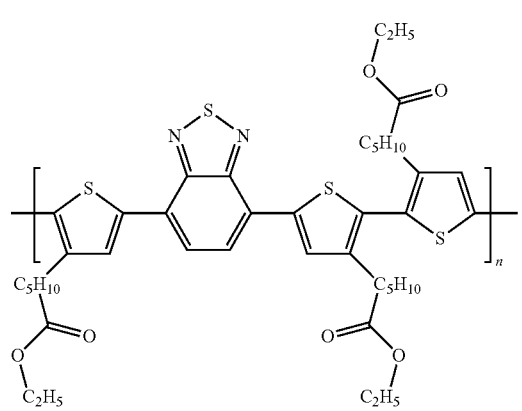
[15]
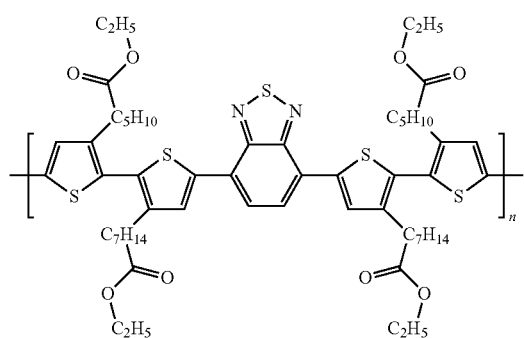
[16]
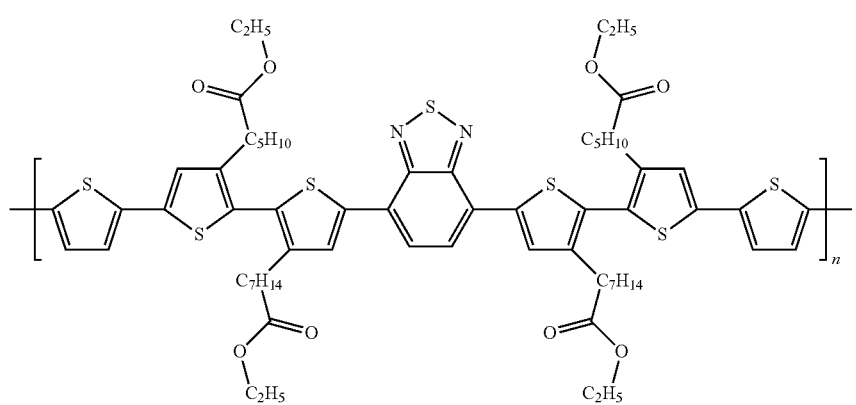
[17]

-continued
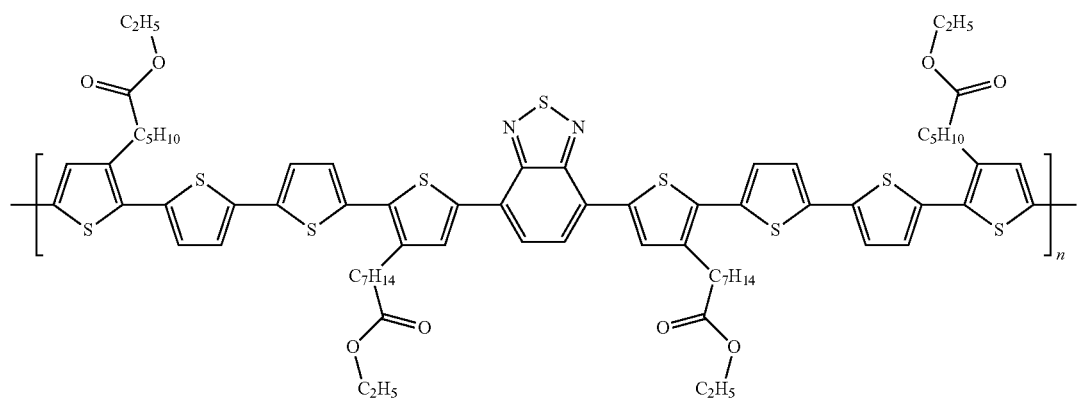
[18]
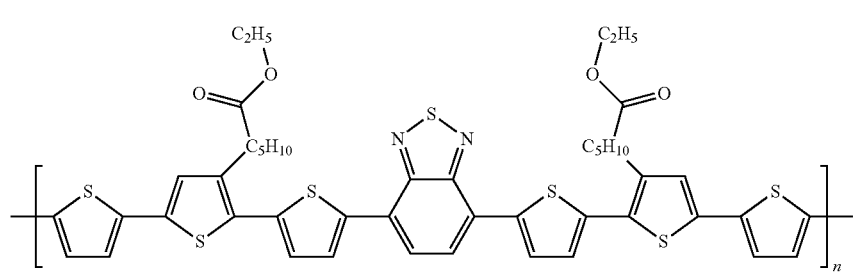
[19]
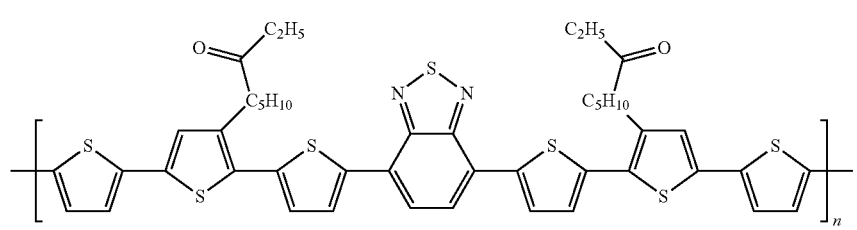
[20]
[Chemical formula 5]
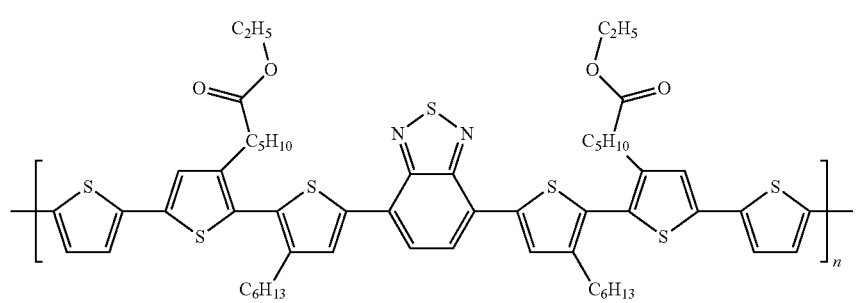
[21]

[22]
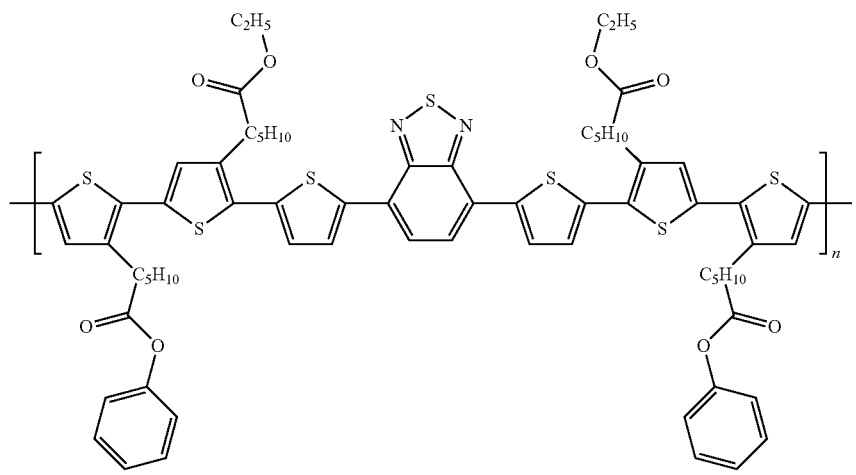
[23]
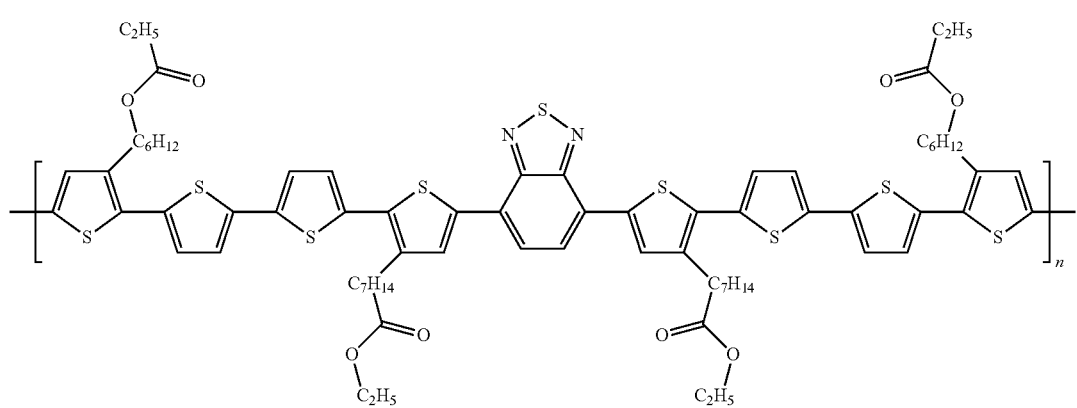
[24]
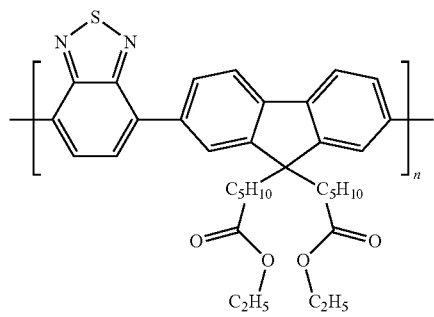
[25]
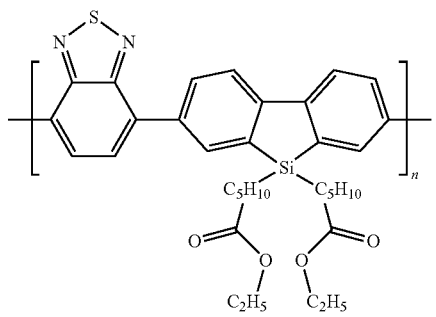
[26]
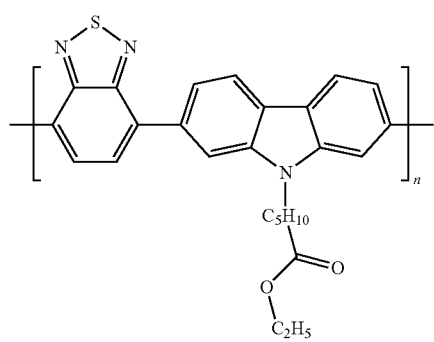
[27]
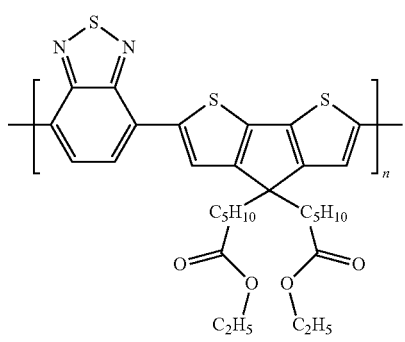

-continued
[Chemical formula 6]
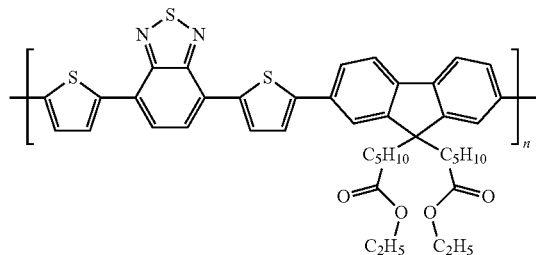
[28]
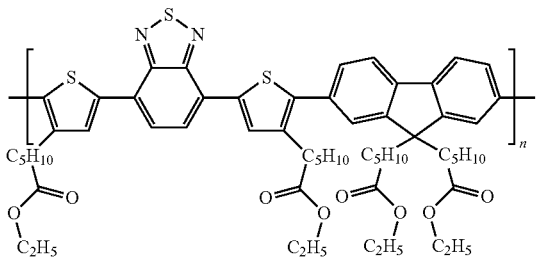
[29]
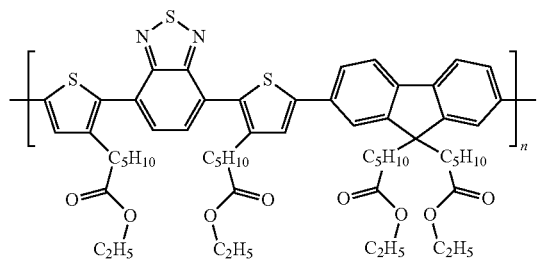
[30]
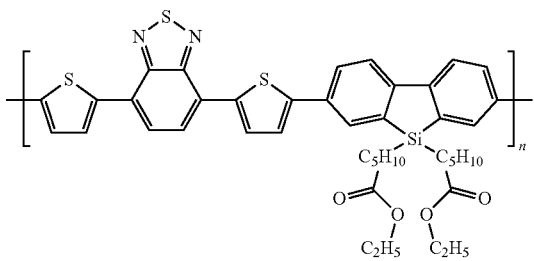
[31]
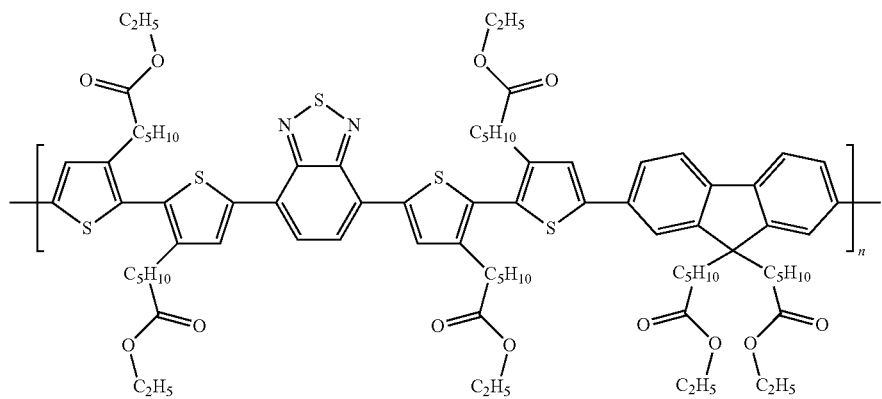
[32]
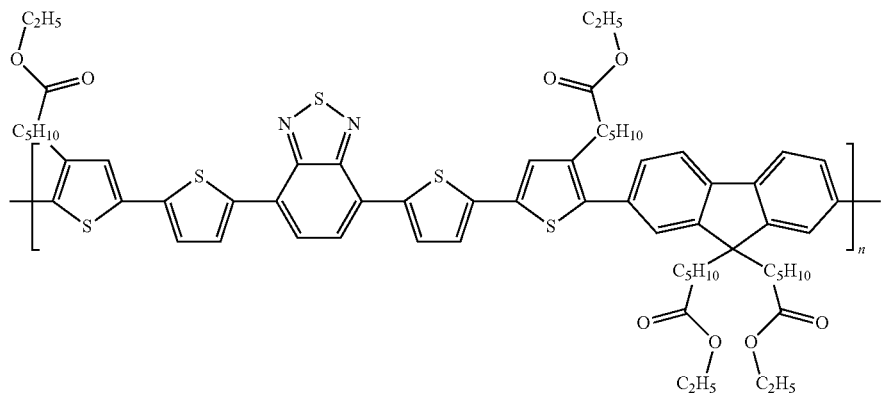
[33]

[34]
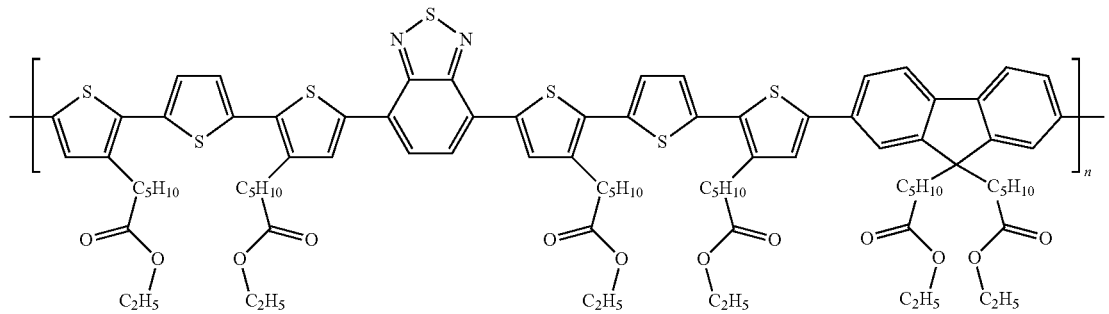
[Chemical formula 7]
[35]
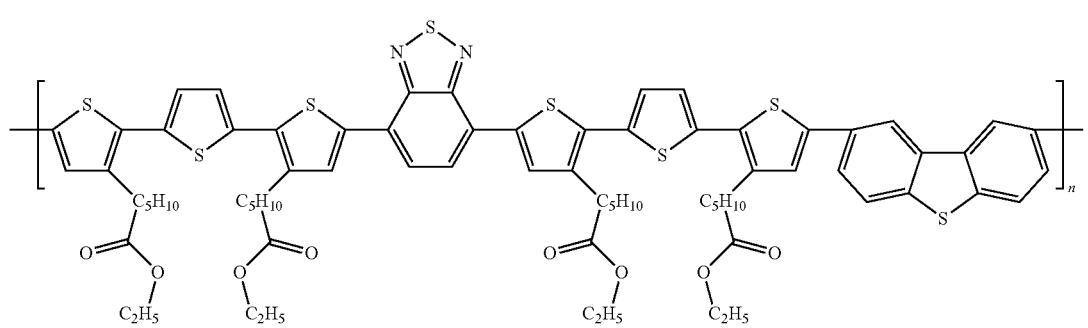
[36]
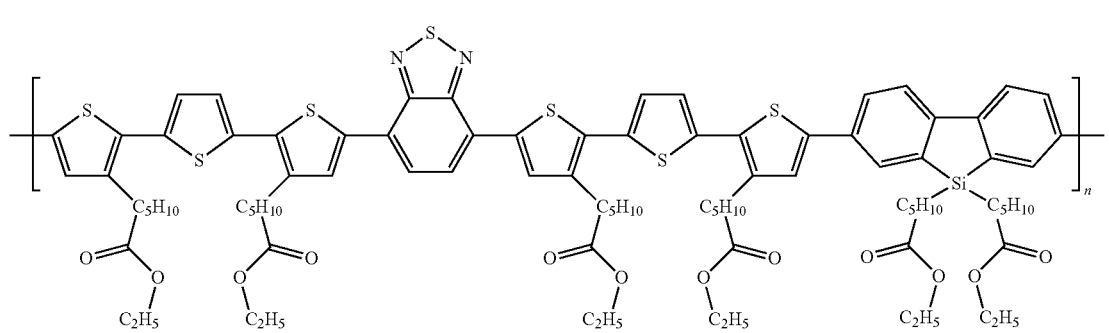
[37]
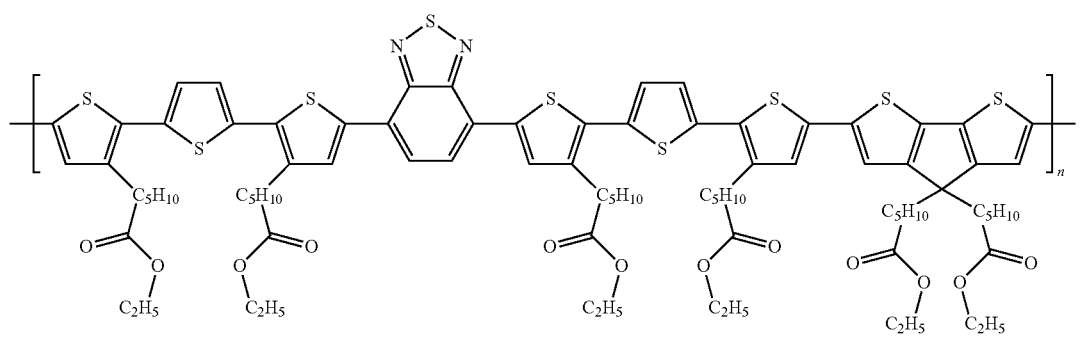

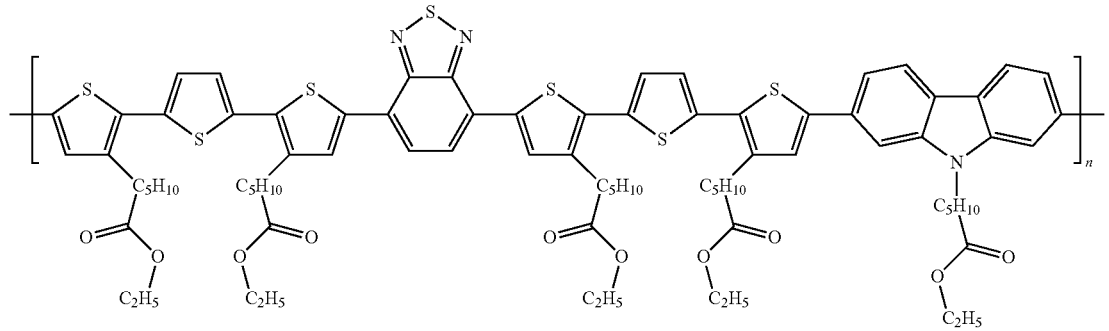
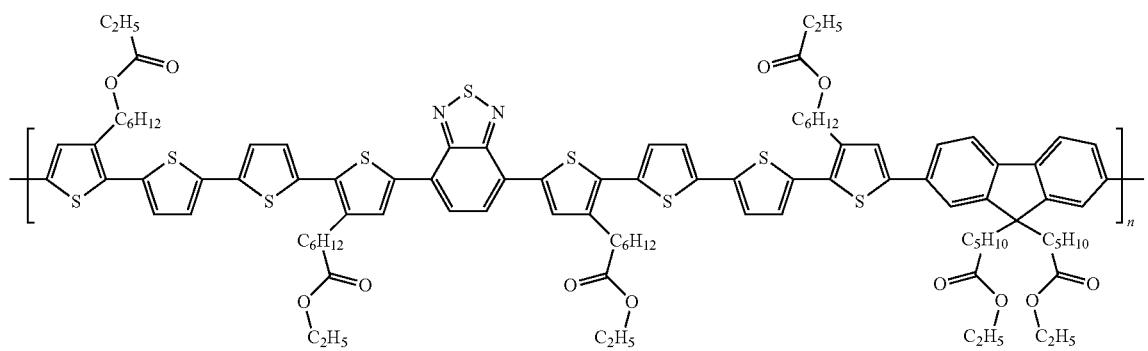
[Chemical formula 8]
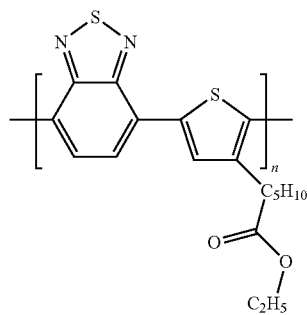
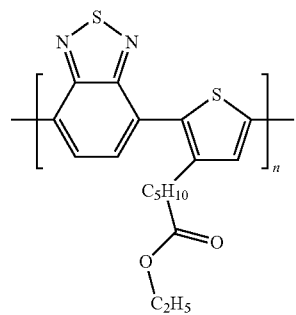
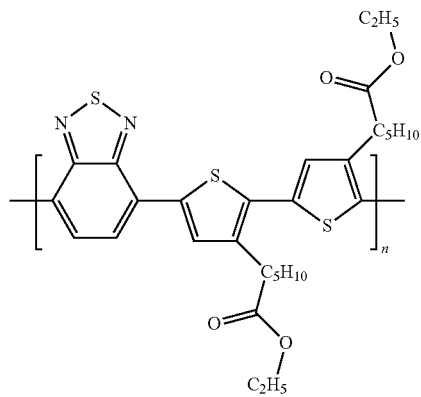
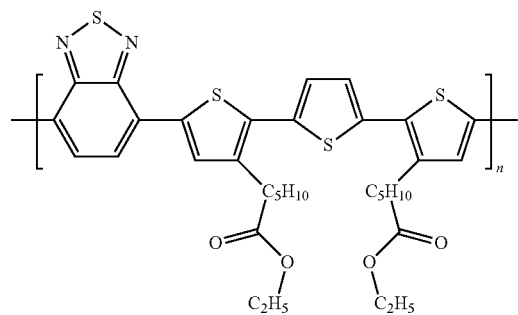

-continued
[44]
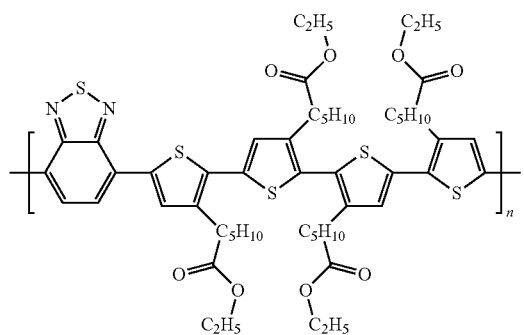
[45]
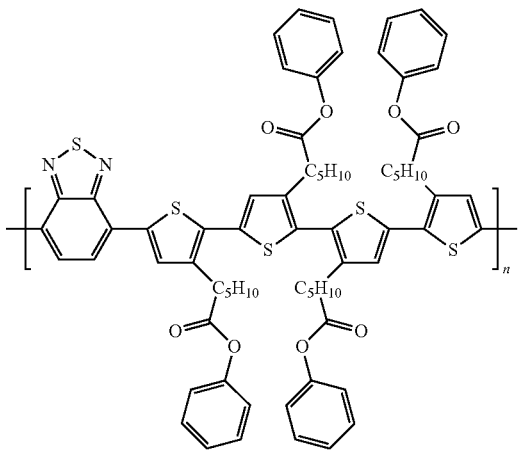
[46]
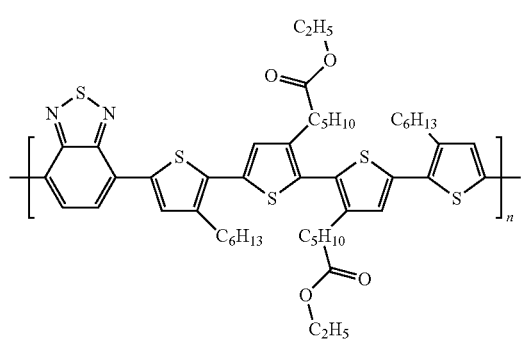
[47]
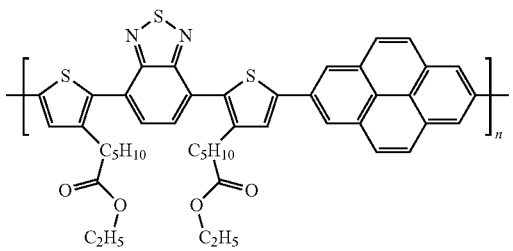
[48]
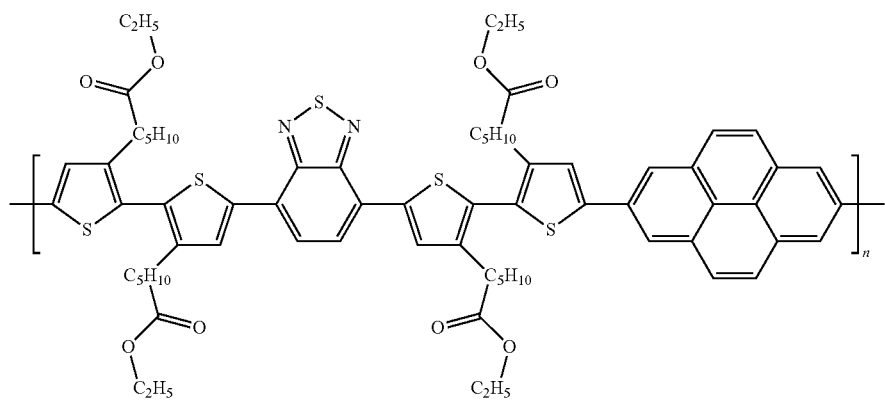
[Chemical formula 9]
[49]
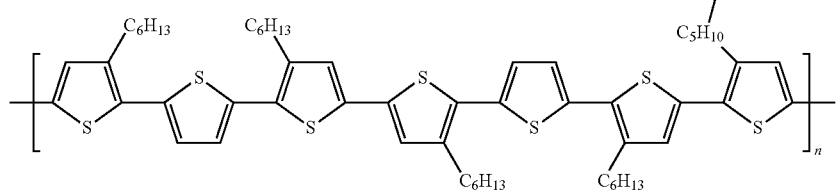

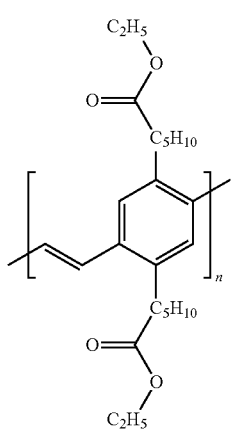 [50]

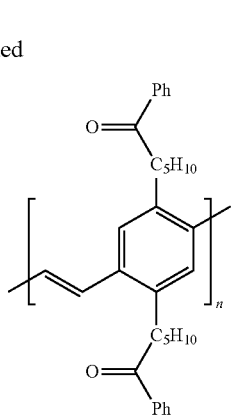 [51]

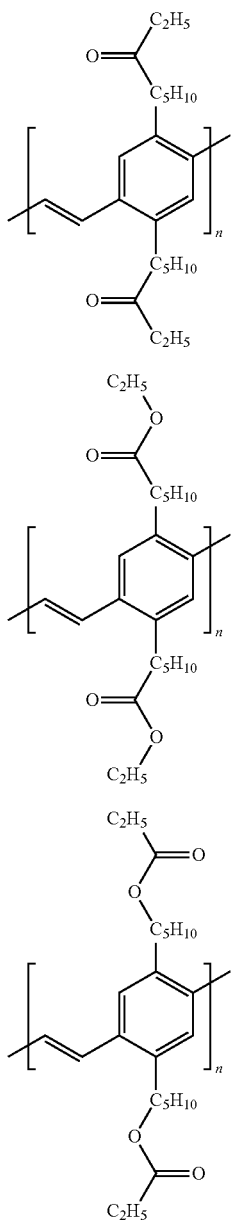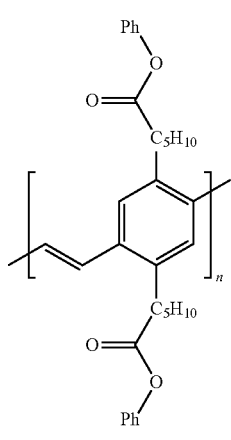 [52]

[53]

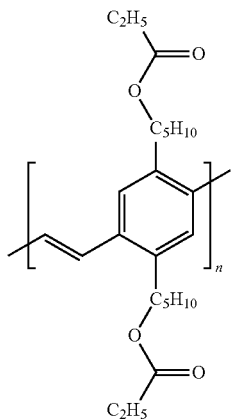 [54]

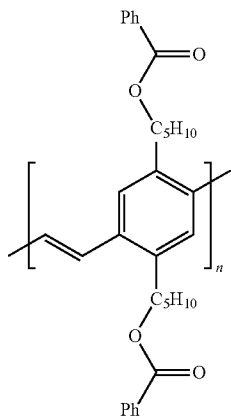 [55]

The side chain described here is a group bonded to a main chain of the conjugated polymer. The main chain of the conjugated polymer corresponds to an unsaturated group that forms a ring structure by bonding (1) conjugated structures and (2) conjugated structures to each other. As (2), for example, a carbon atom at position 9 of a fluorene unit is contained in the main chain.

n represents the polymerization degree of the conjugated polymer, and is preferably in a range of 2 to 1000. Considering easy attachment to CNTs, n is more preferably in a range of 3 to 500. In the present invention, a polymerization degree n is a value obtained from a weight average molecular weight. The weight average molecule weight is obtained by measurement using GPC (gel permeation chromatography), and conversion using a standard sample of polystyrene. Further, it is preferable that the weight average molecular weight of the conjugated polymer is 1000 or more, in view of easy attachment to CNTs.

Moreover, it is preferable that a ratio of the number of units having a side chain represented by the general formula (1) to the number of all units of the conjugated polymer [the number of units having a side chain represented by the general formula (1)/the number of all units of the conjugated polymer] is 1/5 to 1/1. Within this range, compatibility with a solvent having a suitable viscosity can be further improved.

The unit described here is understood as a divalent group containing one of any one selected from the group consisting of an ethenylene group, an ethynylene group, an arylene group and a heteroarylene group as a divalent group contained in the main chain of the conjugated polymer. The number of units refers to number when each of the ethenylene group, ethynylene group, arylene group or heteroarylene group of the main chain in the repeating unit is counted as one unit. The phrase "the number of units having a side chain represented by the general formula (1)" means the number of units having a side chain represented by the general formula (1) among the units, and the phrase "the number of all units of the conjugated polymer" means the total number of units. For example, in polymer [4], [the number of units having a side chain represented by the general formula (1)/the number of all units of the conjugated polymer]=1/1, in polymer [10], [the number of units having a side chain represented by the general formula (1)/the number of all units of the conjugated polymer]=2/3, in polymer [16], [the number of units having a side chain represented by the general formula (1)/the number of all units of the conjugated polymer]=4/5, and in polymer [53], [the number of units having a side chain represented by the general formula (1)/the number of all units of the conjugated polymer]=1/2.

The conjugated polymer can be synthesized by a known method. Examples of a method for coupling thiophenes to each other include a method in which a halogenated thiophene is coupled with a thiopheneboronic acid or a thiopheneboronate in the presence of a palladium catalyst and a method in which a halogenated thiophene is coupled with a thiophene Grignard reagent in the presence of a nickel or palladium catalyst. Moreover, in the case of coupling a thiophene unit with another unit as well, another halogenated unit and a thiophene unit can be coupled with each other by a similar method. In addition, a conjugated polymer can be obtained by introducing a polymerizable functional group into an end of the monomer thus obtained and allowing polymerization to proceed in the presence of a palladium catalyst or a nickel catalyst.

It is preferable to use a conjugated polymer obtained by removing impurities such as raw materials used in synthesis process and by-products. As a method for removing impurities, it is possible to use, for example, silica gel columnography, a Soxhlet extraction method, a filtration method, an ion exchange method, a chelation method, or the like. Two or more of these methods may be combined.

<CNT Dispersion Liquid>

The CNT dispersion liquid of the present invention contains at least a CNT composite in which a conjugated polymer having a side chain represented by the general formula (1) is attached to at least a part of the surface of CNTs, and a solvent. By using a conjugated polymer having a side chain represented by the general formula (1), a CNT dispersion liquid having good CNT dispersibility can be obtained with a solvent suitable for coating by inkjet.

Solubility parameter (SP value) of the solvent is preferably 19.5 to 24.0 $(MPa)^{1/2}$. Within this range, it is compatible with polarities of the CNTs and the CNT composite, and the CNTs can be well dispersed. The SP value of the solvent is more preferably 20.0 to 23.5 $(MPa)^{1/2}$.

Here, the solubility parameter is a value calculated from the types and ratio of materials constituting the solvent, by using Fedors' estimation method, which is used commonly and described in Poly. Eng. Sci., vol. 14, No. 2, pp 147-154 (1974), and the like. For example, the solubility parameter of o-dichlorobenzene can be calculated as 20.5 $(MPa)^{1/2}$, and the solubility parameter of ethyl benzoate can be calculated as 21.5 $(MPa)^{1/2}$.

Moreover, when the solvent consists of a mixture of a plurality of solvents, it is calculated by multiplying the solubility parameter of each solvent by respective mole fraction and taking the sum thereof. For example, when the solvent consists of solvent A and solvent B, it is calculated from the following formula;

(Solubility parameter of solvent)=(Solubility parameter of solvent $A$)×(Mole fraction of solvent $A$)+(Solubility parameter of solvent $B$)×(Mole fraction of solvent $B$)

For example, in the case of a solvent containing 50% by weight (mole fraction: 48.8%) of terpineol (solubility parameter 20.9 $(MPa)^{1/2}$) and 50% by weight (mole fraction: 51.2%) of o-dichlorobenzene (solubility parameter 20.5 $(MPa)^{1/2}$), the solubility parameter of the solvent is 20.7 $(MPa)^{1/2}$.

Boiling point of the solvent is preferably 150 to 290° C., and/or vapor pressure is preferably 0.9 to 500 Pa. Within this range, clogging of an inkjet head due to drying of the dispersion liquid at a coating outlet of the inkjet head can be avoided, and the dispersion liquid discharged on a substrate can be dried by a drying step. The boiling point of the solvent is more preferably 170 to 270° C. The vapor pressure of the solvent is more preferably 1.1 to 400 Pa. Also, the above vapor pressure is a value at 20° C.

Specific examples of the above solvent include, for example, aromatic solvents such as dibenzyl ether, 3-phenoxytoluene, benzyl benzoate, veratrole, 1-methylnaphthalene, a-tetralone, dimethyl phthalate, diethyl phthalate, 1-chloronaphthalene, 1-methoxynaphthalene, methyl o-anisate and benzyl alcohol; terpene-based solvents such as limonene, isophorone, carvone and terpineol; glycol-based solvents such as ethylene glycol monophenyl ether, phenyldiglycol, phenylpropylene glycol, diethylene glycol monobutyl ether, butyl carbitol, dipropylene glycol monobutyl ether, dipropylene glycol monomethyl ether, diethylene glycol methyl ether, triethylene glycol monomethyl ether and triethylene glycol monobutyl ether; triacetin and the like.

Among them, the viscosity of the solvent is preferably 3 to 20 cP. Within this range, it is possible to suppress generation of satellites in coating by inkjet and improve coating position accuracy. The viscosity of the solvent is more preferably 5 to 18 cP, and further more preferably 7 to 13 cP. The viscosity of the CNT dispersion liquid is about the same as the viscosity of the solvent.

Specific examples of a solvent having a viscosity of 3 to 20 cP include dibenzyl ether, 3-phenoxytoluene, benzyl benzoate, veratrole, a-tetralone, dimethyl phthalate, diethyl phthalate, 1-chloronaphthalene, 1-methoxynaphthalene, methyl o-anisate, benzyl alcohol, ethylene glycol monophenyl ether, diethylene glycol monobutyl ether, butyl carbitol, dipropylene glycol monobutyl ether, dipropylene glycol monomethyl ether, diethylene glycol methyl ether, triethylene glycol monomethyl ether, triethylene glycol monobutyl ether, triacetin, and the like. Among them, a-tetralone and benzyl benzoate are preferable.

Further, the solvent is preferably a mixed solvent containing a halogenated aromatic solvent. By containing a halogenated aromatic solvent, it becomes easy to adjust the SP value and viscosity of the solvent within appropriate ranges. In addition, the halogenated aromatic solvent has good compatibility with CNTs and can improve CNT dispersibility. Example of the solvent include a mixed solvent of o-dichlorobenzene/terpineol=50% by weight/50% by weight (SP value 20.7 $(MPa)^{1/2}$, viscosity 3.7 cP) and the like.

<Semiconductor Device>

The semiconductor device according to the embodiment of the present invention is a semiconductor device including a substrate, a source electrode, a drain electrode and a gate electrode, a semiconductor layer in contact with the source electrode and the drain electrode, and a gate insulating layer that insulates the semiconductor layer from the gate electrode, and the semiconductor layer contains a CNT composite in which a conjugated polymer having a side chain represented by the general formula (1) is attached to at least a part of the surface of CNTs.

FIG. 1 is a schematic cross-sectional view showing a first example of a semiconductor device according to the embodiment of the present invention. It has a gate electrode 2 formed on an insulating substrate 1, a gate insulating layer 3 covering the gate electrode 2, a source electrode 5 and a drain electrode 6 provided on the gate insulating layer 3, and a semiconductor layer 4 provided between the electrodes. The semiconductor layer 4 contains a CNT composite 7.

This structure is a so-called bottom-gate bottom-contact structure in which the gate electrode is arranged on a lower side of the semiconductor layer and the source electrode and the drain electrode are arranged on a lower surface of the semiconductor layer.

Figure 2:
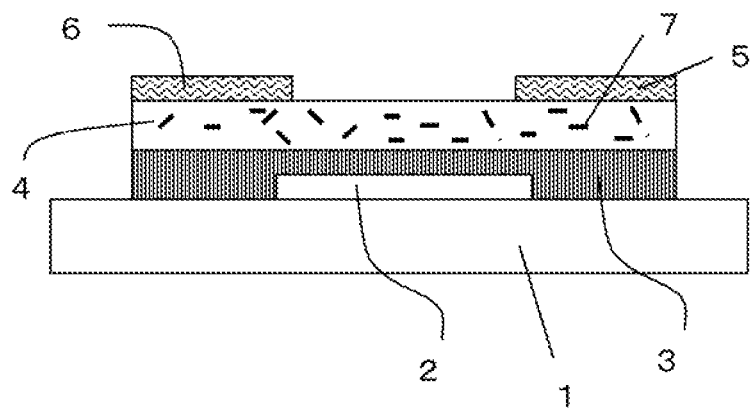
FIG. 2 is a schematic cross-sectional view showing a semiconductor device which is one of the embodiments of the present invention.

FIG. 2 is a schematic cross-sectional view showing a second example of the semiconductor device according to the embodiment of the present invention. It has a gate electrode 2 formed on an insulating substrate 1, a gate insulating layer 3 covering the gate electrode 2, a semiconductor layer 4 provided on the gate insulating layer 3, a source electrode 5 and a drain electrode 6 formed on the semiconductor layer 4. The semiconductor layer 4 contains a CNT composite 7.

This structure is a so-called bottom-gate top-contact structure in which the gate electrode is arranged on a lower side of the semiconductor layer and the source electrode and the drain electrode are arranged on an upper surface of the semiconductor layer.

The structure of the semiconductor device according to the embodiment of the present invention is not limited to these. Further, the following description is common regardless of the structure of the semiconductor device unless otherwise specified.

(Substrate) The substrate may be made of any material as long as at least a surface on which an electrode system is arranged has insulating properties. As the substrate, for example, substrates made of inorganic materials such as silicon wafer, glass, sapphire and sintered alumina; and substrates made of organic materials such as polyimide, polyvinyl alcohol, polyvinyl chloride, polyethylene terephthalate, polyvinylidene fluoride, polysiloxane, polyvinylphenol (PVP), polyester, polycarbonate, polysulfone, polyethersulfone, polyethylene, polyphenylene sulfide and polyparaxylene are preferable.

Moreover, the substrate may be, for example, a substrate in which a plurality of materials are laminated, such as a substrate in which a PVP film is formed on a silicon wafer or a substrate in which a polysiloxane film is formed on polyethylene terephthalate.

(Electrode)

The material used for the gate electrode, the source electrode and the drain electrode may be any conductive material as long as it can generally be used as an electrode. Examples of the material include, but not limited to, conductive metal oxides such as tin oxide, indium oxide, and indium tin oxide (ITO); metals such as platinum, gold, silver, copper, iron, tin, zinc, aluminum, indium, chromium, lithium, sodium, potassium, cesium, calcium, magnesium, palladium, molybdenum, amorphous silicon, and polysilicon, and alloys thereof; inorganic conductive materials such as copper iodide and copper sulfide; polythiophene, polypyrrole, polyaniline; a complex of polyethylenedioxythiophene and polystyrene sulfonic acid and the like; conductive polymers of which conductivity has been improved by doping with iodine or the like; carbon materials and the like; materials containing an organic component and a conductor; and the like.

These electrode materials may be used alone, or a plurality of materials may be laminated or used in mixture.

Among them, it is preferable that the electrode contains an organic component and a conductor in that flexibility of the electrode is enhanced, adhesion between the substrate and the gate insulating layer is good even when bent, and electrical connection with wiring and the semiconductor layer is improved.

The organic component is not particularly limited, and examples thereof include monomers, oligomers, polymers, photopolymerization initiators, plasticizers, leveling agents, surfactants, silane coupling agents, defoaming agents, and pigments. Oligomers or polymers are preferable from the viewpoint of improving bending resistance of the electrodes.

The conductor may be any conductive material that can be generally used as an electrode, but is preferably a conductive particle.

Examples of the conductive particle include gold, silver, copper, nickel, tin, bismuth, lead, zinc, palladium, platinum, aluminum, tungsten, molybdenum, carbon, or the like. More preferable conductive particle is a conductive particle containing at least one element selected from the group consisting of gold, silver, copper, nickel, tin, bismuth, lead, zinc, palladium, platinum, aluminum and carbon. These conductive particles may be used alone, as an alloy, or as mixed particles.

Among these, gold, silver, copper or platinum particles are preferable from the viewpoint of conductivity. Among them, silver particles are more preferable from the viewpoint of cost and stability.

Further, width and thickness of each of the gate electrode, the source electrode and the drain electrode, and a distance between the source electrode and the drain electrode can be designed to any value. For example, it is preferable that the electrode width is preferably 10 μm to 10 mm, the electrode thickness is 0.01 μm to 100 μm, and the distance between the source electrode and the drain electrode is 1 μm to 1 mm, respectively, but they are not limited thereto.

A method of forming the electrode is not particularly limited, and examples thereof include methods using a known technique such as resistance heating evaporation, electron beam, sputtering, plating, CVD, ion plating coating, inkjet, and printing. Further, another example of the method of forming the electrode includes a method in which the electrode is formed by applying a paste containing an organic component and a conductor to an insulating substrate by a known technique such as a spin coating method, a blade coating method, a slit die coating method, a screen printing method, a bar coater method, a mold method, a printing and transferring method or an immersion and withdrawal method, and drying the paste using an oven, a hot plate, infrared rays or the like.

In addition, as a method of forming an electrode pattern, an electrode thin film prepared by the above method may be subjected to patterning into a desired shape by a known photolithography method or the like, or subjected to patterning through a mask in a desired shape at the time of vapor deposition or sputtering of an electrode material.

(Gate Insulating Layer)

The material used for the gate insulating layer is not particularly limited, but examples thereof include inorganic materials such as silicon oxide and alumina; organic polymer materials such as polyimide, polyvinyl alcohol, polyvinyl chloride, polyethylene terephthalate, polyvinylidene fluoride, polysiloxane, and polyvinyl phenol (PVP); and mixtures of an inorganic material powder and an organic material.

Among them, those containing an organic compound containing a bond between silicon and carbon are preferable.

Examples of the organic compound containing a bond between silicon and carbon include silane compounds, epoxy group-containing silane compounds, condensates thereof, polysiloxanes containing these as a copolymerization component, and the like. Among these, polysiloxanes are more preferable from the viewpoint of high insulating properties and low-temperature curing.

It is preferable that the gate insulating layer further contains a metal compound containing a bond between a metal atom and an oxygen atom. Such a metal compound is not particularly limited, and examples thereof include metal oxides, metal hydroxides, and the like. The metal atom contained in the metal compound is not particularly limited as long as it forms a metal chelate. Examples of the metal atom include magnesium, aluminum, titanium, chromium, manganese, cobalt, nickel, copper, zinc, gallium, zirconium, ruthenium, palladium, indium, hafnium, platinum, and the like. Among them, aluminum is preferable in terms of easy availability, cost, and stability of the metal chelate.

Moreover, it is preferable that the gate insulating layer further contains a polymer to which inorganic particles are bonded. The inorganic particles are not particularly limited as long as they are particles made of an inorganic substance, but particles made of a metal compound or a semi-metal compound are preferable. Examples of the metal or semi-metal include elements selected from the group consisting of silicon, magnesium, calcium, strontium, barium, lanthanum, cerium, tin, titanium, zirconium, hafnium, yttrium, niobium, tantalum, and aluminum. Examples of the metal compound or semi-metal compound include halides, oxides, nitrides, hydroxides, carbonates, sulfates, nitrates and metasilicates of the above metals or semi-metals. Among these, a metal oxide is preferable from the viewpoint of improving on-current of a FET. Preferred examples thereof include particles such as tin oxide-titanium oxide composite particles, silicon oxide-titanium oxide composite particles, titanium oxide particles, zirconium oxide particles, hafnium oxide, yttrium oxide particles, niobium oxide particles, tantalum oxide particles, tin oxide-zirconium oxide composite particles, silicon oxide-zirconium oxide composite particles, aluminum oxide particles, barium titanate particles, strontium titanate particles and barium titanate-strontium titanate composite particles.

The film thickness of the gate insulating layer is preferably 0.05 to 5 μm, and more preferably 0.1 to 1 μm. By setting the film thickness in this range, uniform thin film formation is facilitated. The film thickness can be measured by an atomic force microscope, an ellipsometry method, or the like.

Relative permittivity of the gate insulating layer is preferably 5 or more, more preferably 7 or more, further preferably 8.5 or more, and particularly preferably 10 or more. When the relative permittivity is in the above ranges, the on-current of the FET can be increased. In addition, the relative permittivity is preferably 20 or less, more preferably 15 or less, further preferably 13.5 or less, and particularly preferably 12 or less. When the relative permittivity is in the above ranges, excessive dielectric loss due to the gate insulating layer can be prevented, and in particular, a FET driven by a radio wave in a high frequency band of 100 MHz or more can perform accurate operation.

The method for preparing the gate insulating layer is not particularly limited, and examples thereof include a method in which a coating film obtained by applying a composition containing a material for forming the insulating layer to a substrate, and drying the composition is subjected to a heat treatment as necessary. Examples of the coating method include known coating methods such as a spin coating method, a blade coating method, a slit die coating method, a screen printing method, a bar coater method, a mold method, a printing and transferring method, an immersion and withdrawal method, and an inkjet method. The temperature for the heat treatment of the coating film is preferably in a range of 100 to 300° C.

The gate insulating layer may be a single layer or a plurality of layers. Also, one layer may be formed from a plurality of insulating materials, or a plurality of insulating materials may be laminated to form a plurality of insulating layers.

(Semiconductor Layer)

The semiconductor layer contains the CNT composite of the present invention. The semiconductor layer may further contain an organic semiconductor or an insulating material as long as it does not impair electrical characteristics.

The film thickness of the semiconductor layer is preferably 1 nm or more and 100 nm or less. Within this range, uniform thin film formation is facilitated. The film thickness of the semiconductor layer is more preferably 1 nm or more and 50 nm or less, and further preferably 1 nm or more and 20 nm or less. The film thickness can be measured by an atomic force microscope, an ellipsometry method, or the like.

As a method of forming the semiconductor layer, it is also possible to use a dry method such as resistance heating vapor deposition, electron beam, sputtering or CVD, but from the viewpoint of manufacturing cost and adaptability to large areas, it is preferable to use a coating method.

Specifically, a spin coating method, a blade coating method, a slit die coating method, a screen printing method, a bar coater method, a mold method, a printing and transferring method, an immersion and withdrawal method, an inkjet method or the like can be preferably used. It is preferable that the coating method is selected from these methods according to properties of the coating film to be obtained, such as coating thickness control and orientation control. Among them, for circuit formation, coating by inkjet is particularly preferable, as the reason described above. In addition, the formed coating film may be subjected to an annealing treatment under the atmosphere, under reduced pressure, or under an inert gas atmosphere such as nitrogen or argon atmosphere.

(Second Insulating Layer)

A second insulating layer is formed on a side opposite to the gate insulating layer with respect to the semiconductor layer. The side opposite to the gate insulating layer with respect to the semiconductor layer refers to, for example, an upper side of the semiconductor layer when the gate insulating layer is provided on a lower side of the semiconductor layer. By forming the second insulating layer, it is possible to adjust characteristics of the semiconductor device and protect the semiconductor layer.

Figure 3:
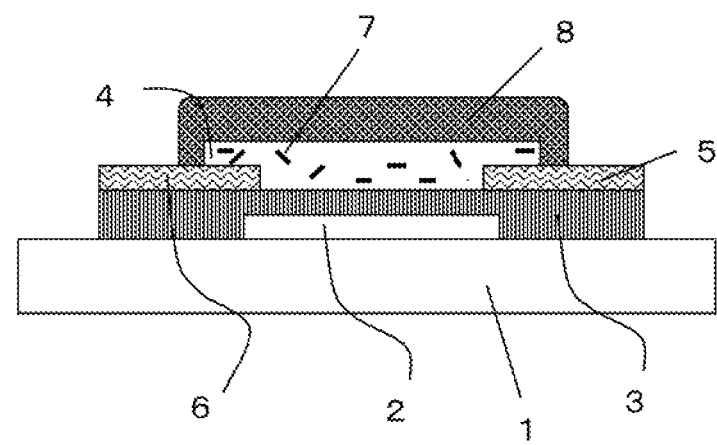
FIG. 3 is a schematic cross-sectional view showing a semiconductor device which is one of the embodiments of the present invention.

FIG. 3 is a schematic cross-sectional view showing a third example of the semiconductor device according to the embodiment of the present invention. It has a gate electrode 2 formed on an insulating substrate 1, a gate insulating layer 3 covering the gate electrode 2, a source electrode 5 and a drain electrode 6 provided on the gate insulating layer 3, a semiconductor layer 4 provided between the electrodes, and a second insulating layer 8 covering the semiconductor layer. The semiconductor layer 4 contains a CNT composite 7.

The material used for the second insulating layer is not particularly limited, but specific examples thereof include inorganic materials such as silicon oxide and alumina; organic polymer materials such as polyimide and a derivative thereof, polyvinyl alcohol, polyvinyl chloride, polyethylene terephthalate, polyvinylidene fluoride, polyacrylonitrile, polysiloxane and a derivative thereof, polyvinylphenol and a derivative thereof, polynorbornene, polystyrene, polycarbonates and derivatives thereof, polyacrylic acid derivatives, and polymethacrylic acid derivatives; or a mixture of an inorganic material powder and an organic polymer material and a mixture of an organic low molecular weight material and an organic high molecular weight material.

Further, the second insulating layer may contain an electron donating compound. Electron donation is an ability of one compound to donate electrons to another compound. An electron donating compound is a compound having an electron donating ability. By including such an electron donating compound in the second insulating layer, a CNT-FET that normally exhibits p-type semiconductor characteristics can be converted to a semiconductor device that exhibits n-type semiconductor characteristics. Examples of the electron donating compound include amide compounds, imide compounds, urea compounds, amine compounds, imine compounds, aniline compounds, nitrile compounds, alkylphosphine compounds, and the like. Among them, amine compounds are preferable, and amidine compounds and guanidine compounds are particularly preferable. Examples of the amidine compound include DBU, DBN, and the like. Examples of the guanidine compound include TBD, MTBD, and the like. These compounds have particularly high electron donating properties, and thus performance of a FET using CNTs as an n-type semiconductor device is further improved, which is preferable.

The film thickness of the second insulating layer is preferably 50 nm or more, and more preferably 100 nm or more, and the upper limit of the film thickness of the second insulating layer is not particularly limited, but it is preferably 1 mm or less, and more preferably 100 μm or less. The second insulating layer may be a single layer or a plurality of layers, and also, one layer may be formed from a plurality of insulating materials, or a plurality of insulating materials may be laminated to form the second insulating layer.

A method of forming the second insulating layer is not particularly limited, and it is also possible to use a dry method such as resistance heating vapor deposition, electron beam, sputtering or CVD, but from the viewpoint of manufacturing cost and adaptability to large areas, it is preferable to use a coating method. The coating method includes at least a step of coating a composition in which a material for forming the second insulating layer is dissolved.

In addition, the formed coating film may be subjected to an annealing treatment or dried with hot air under the atmosphere, under reduced pressure or under an inert gas atmosphere such as nitrogen or argon atmosphere.

(Characteristic evaluation of semiconductor device) In the semiconductor device according to the embodiment of the present invention, a current flowing between the source electrode and the drain electrode (source-drain current) can be controlled by changing a gate voltage. Then, mobility p (cm$^2$/(V·s)) of the semiconductor device can be calculated by using the following equation (a).

$$\mu = (\delta Id/\delta Vg) L \cdot D/(W \cdot \varepsilon r \cdot \varepsilon \cdot Vsd) \times 10000 \tag{a}$$

Where Id denotes source-drain current (A), Vsd denotes source-drain voltage (V), Vg denotes gate voltage (V), D denotes thickness of the gate insulating layer (m), L denotes channel length (m), W denotes channel width (m), εr denotes relative permittivity of the gate insulating layer, ε denotes permittivity of a vacuum (8.85×10$^{-12}$ F/m), and δ denotes an amount of change in the corresponding physical quantity.

(Method for Producing Semiconductor Device)

The method for producing a semiconductor device according to the embodiment of the present invention is not particularly limited, but preferably includes a step of forming a semiconductor layer by using a coating method. The method for forming the semiconductor layer is as described above.

<Wireless Communication Device>

Next, the wireless communication device according to the embodiment of the present invention containing the semiconductor device of the present invention will be described. The wireless communication device is a device that performs electrical communication in a way that an RFID tag receives a carrier wave transmitted from an antenna mounted on a reader/writer, such as RFID, for example.

As a specific operation, for example, an antenna of the RFID tag receives a radio signal transmitted from the antenna mounted on the reader/writer. Then, an alternating current generated in response to the signal is converted into a direct current by rectifier circuit, and the RFID tag is generated. Next, the generated RFID tag receives a command from the radio signal and operates in response to the command. Thereafter, a reply as a result in response to the command is transmitted from the antenna of the RFID tag to the antenna of the reader/writer as a radio signal. The operation in response to the command is performed by at least a known demodulation circuit, an operation control logic circuit, and a modulation circuit.

Figure 4:
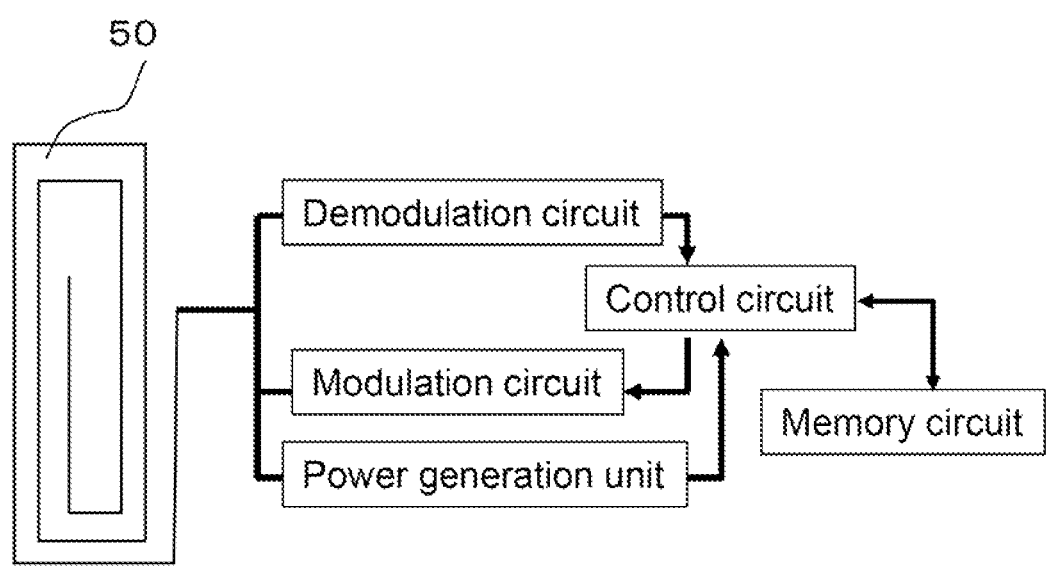
FIG. 4 is a block diagram showing an example of a wireless communication device using a semiconductor device or a complementary semiconductor device, which is one of the embodiments of the present invention.

The wireless communication device according to the embodiment of the present invention includes at least the above-mentioned semiconductor device and an antenna. Examples of more specific configuration of the wireless communication device according to the embodiment of the present invention include one shown in FIG. 4. This is composed of a power generation unit which rectifies a modulated wave signal received from outside by an antenna 50 and supplies power to each unit; a demodulation circuit which demodulates the modulated wave signal and sends it to a control circuit, a modulation circuit which modulates data sent from the control circuit and sends it to the antenna, and the control circuit which writes the data demodulated by the demodulation circuit in a memory circuit, reads the data from the memory circuit and sends it to the modulation circuit, in which the circuit units are electrically connected. The demodulation circuit, control circuit, modulation circuit and memory circuit are composed of the above-mentioned n-type semiconductor device or a complementary semiconductor device, and may further include a capacitor, a resistance device, and a diode. The memory circuit further has a non-volatile rewritable memory unit such as EEPROM (Electrically Erasable Programmable Read-Only Memory) and FeRAM (Ferroelectric Random Access Memory). The power generation unit is composed of a capacitor and a diode.

The antenna, capacitor, resistance device, diode, and non-volatile rewritable memory unit may be any commonly used material, and the material and shape used are not particularly limited. Further, the material for electrically connecting the above components may be any conductive material that can be generally used. The connection method of the components may be any method as long as it can be electrically conductive. The width and thickness of the connection portions of the components are arbitrary.

<Merchandise Tag>

Next, a merchandise tag containing the wireless communication device according to the embodiment of the present invention will be described. The merchandise tag has, for example, a base body and the wireless communication device coated with the base body.

The base body is formed by, for example, a non-metallic material such as paper, which is formed in a flat plate shape. For example, the base body has a structure in which two sheets of flat paper are bonded together, and the wireless communication device is arranged between the two sheets of paper. For example, individual identification information for identifying an individual product is stored in advance in the memory circuit of the wireless storage device.

Wireless communication is performed between this merchandise tag and the reader/writer. The reader/writer is a device which wirelessly reads and writes data from/in the merchandise tag. The reader/writer exchanges data with the merchandise tag in a merchandise distribution process and payment. Examples of the reader/writer include those of a portable type and those of a fixed type installed at checkout counters. A known reader/writer can be used for the merchandise tag according to the embodiment of the present invention.

The merchandise tag according to the embodiment of the present invention has an identification information return function. This is a function of wirelessly returning the individual identification information stored by itself when the merchandise tag receives a command from a predetermined reader/writer which requires the individual identification information to be transmitted. With a single command from the reader/writer, individual identification information for each tag is transmitted from a large number of merchandise tags. With this function, for example, it is possible to simultaneously identify a large number of merchandise items in a non-contact manner at merchandise checkout counters. Therefore, it is possible to facilitate and accelerate settlement process as compared with identification by barcode.

Further, for example, at payment for merchandise items, it is possible to transmit merchandise information read by the reader/writer from the merchandise tag to a POS (point of sale system) terminal. With this function, it is also possible to register a sale of a merchandise specified by the merchandise information at the POS terminal, so that it is possible to facilitate and accelerate inventory management.

EXAMPLES

Hereinafter, the present invention will be described more specifically based on examples. It should be noted that the present invention is not to be considered limited to the following examples.

<Molecular Weight of Conjugated Polymer>

Molecular weight of a conjugated polymer was measured as follows. After filtering a sample through a membrane filter with a pore size of 0.45 μm, the molecular weight of a conjugated polymer was determined in terms of polystyrene standard sample, using GPC (GEL PERMEATION CHROMATOGRAPHY: HLC-8220GPC manufactured by Tosoh Corporation) (developing solvent: chloroform or tetrahydrofuran, developing rate: 0.4 mL/min).

<Viscosity of Solvent>

The viscosity of the solvent was measured using a viscometer (RE110L manufactured by Toki Sangyo Co., Ltd). The measurement was performed at a measurement temperature of 25° C., and at a rotation speed of 100 rpm when the viscosity of the solvent was 0.6 cP or more and 6 cP or less, at a rotation speed of 50 rpm when it was 6 cP or more and 12 cP or less, at a rotation speed of 20 rpm when it was 12 cP or more and 30 cP or less, and at a rotation speed of 10 rpm when it was 30 cP or more and 60 cP or less, and the average value of the results of three measurements was taken as the viscosity of the solvent.

<Dispersibility of CNTs>

Dispersibility of CNTs was evaluated as follows. The CNT dispersion liquid was filtered through a membrane filter with a pore size of 10 μm, and the dispersibility of CNTs was evaluated as A when the concentration reduction rate of the CNT dispersion liquid before and after filtration was 0% or more and 15% or less, B when it was greater than 15% and 30% or less, C when it was greater than 30% and 50% or less, and D when it was greater than 50% and 100% or less.

<Inkjet Coating Properties>

Inkjet coating properties were evaluated as follows. Using an inkjet device (manufactured by Toray Engineering Co., Ltd.), the CNT dispersion liquid was discharged, and the number of satellites was evaluated as A for 0, B for 1 to 3, and C for 4 or more, and the coating position accuracy was evaluated as A for a case within 20 μm, B for a case greater than 20 μm and within 30 μm, C for a case greater than 30 μm and within 50 μm, and D for a case greater than 50 μm. For example, the phrase "coating position accuracy is 20 μm" means that a target pattern is coated with an inkjet coating at 30 locations, a distance between a target impact position and an actual impact position is each measured, and the average value thereof is 20 μm.

<Mobility>

Mobility was evaluated as follows. A semiconductor device was prepared using a CNT dispersion liquid, and source-drain current (Id)-source-drain voltage (Vsd) characteristics of the semiconductor device when gate voltage (Vg) was changed were measured. The measurement was performed in an atmosphere using Model 4200-SCS Semiconductor Characterization System (manufactured by Keithley Instruments). Mobility of a linear region was obtained from the change in the value of Id at Vsd of +5V when changing Vg from +30 to −30V.

Preparation Examples of CNT Dispersion Liquid

Preparation Example 1 of CNT Dispersion Liquid; CNT Dispersion Liquid A 1.0 mg of CNT1 (manufactured by CNI, Inc., single-walled CNT, purity: 95%) was added to 10 mL of a chloroform solution of 5.0 mg of compound [4] (manufactured by Rieke Metals, LLC), and the mixture was subjected to, while cooling with ice, ultrasonic agitation at an output of 40% for 2 hours using an ultrasonic homogenizer (VCX-500 manufactured by TOKYO RIKAKIKAI CO, LTD) to obtain CNT dispersion liquid 1 (CNT composite concentration with respect to solvent: 0.96 g/L). Next, the CNT dispersion liquid 1 was filtered using a membrane filter (pore diameter 10 μm, diameter 25 mm, Omnipore Membrane manufactured by Millipore Corporation). After adding 5 mL of 1-chloronaphthalene (manufactured by Wako Pure Chemical Industries, Ltd.) to the obtained filtrate, chloroform as a low boiling point solvent was distilled off using a rotary evaporator to obtain CNT dispersion liquid 2. 3 mL of 1-chloronaphthalene was added to 1 mL of the CNT dispersion liquid 2 to obtain CNT dispersion liquid A (CNT composite concentration with respect to solvent: 0.03 g/L). The viscosity of the solvent was 3.1 cP.

Preparation Example 2 of CNT Dispersion Liquid; CNT Dispersion Liquid B

Compound [10] was synthesized by the method shown in Formula 10.

[Chemical formula 10]

Formula 10

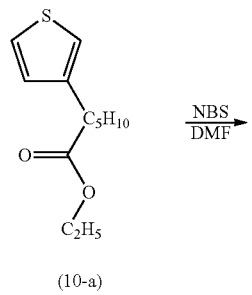
(10-a)

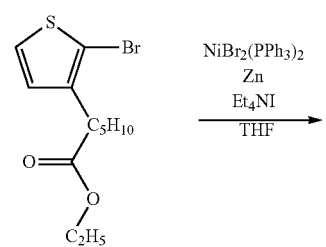
(10-b)

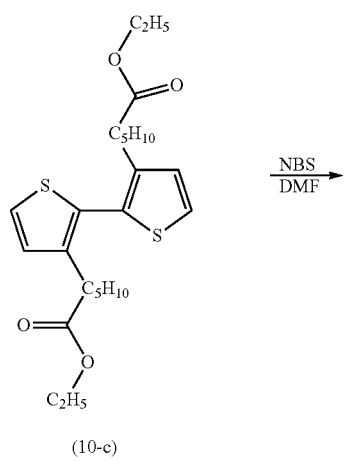
(10-c)

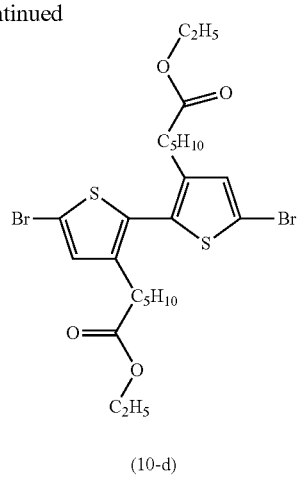
(10-d)

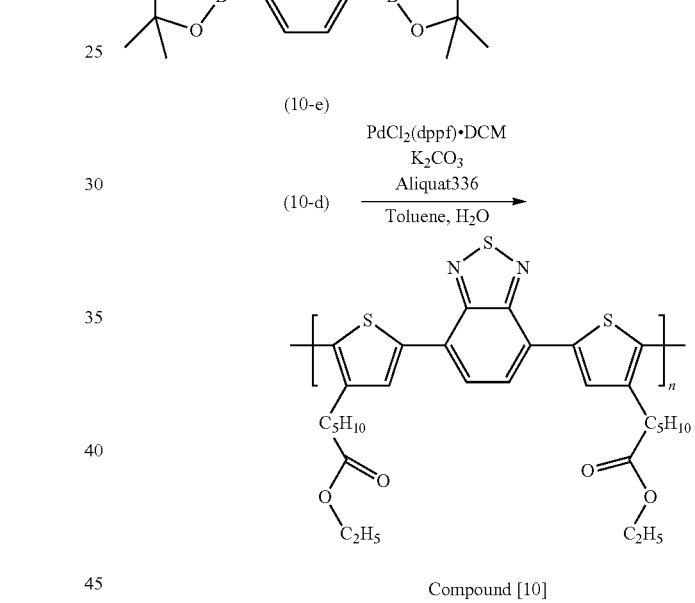

Compound [10]

1.1 g of compound (10-a) (Rieke Metals) was dissolved in 13.3 mL of dimethylformamide, 0.98 g of N-bromosuccinimide (manufactured by Wako Pure Chemical Industries, Ltd.) was added thereto, and the mixture was stirred at room temperature for 24 hours under a nitrogen atmosphere. To the obtained solution were added 100 mL of water, 100 mL of n-hexane and 100 mL of dichloromethane, and the organic layer was separated. The obtained organic layer was washed with 100 mL of water and then dried over magnesium sulfate. The obtained solution was purified by column chromatography (filler: silica gel, eluent: toluene) to obtain 1.4 g of compound (10-b).

In a nitrogen atmosphere, 0.89 g of bis(triphenylphosphine)nickel(II) bromide (manufactured by Sigma Aldrich), 0.39 g of zinc (manufactured by Tokyo Chemical Industry Co., Ltd.) and 1.0 g of tetraethylammonium iodide (manufactured by Tokyo Chemical Industry Co., Ltd.) were stirred with 8.0 mL of tetrahydrofuran (manufactured by Tokyo Chemical Industry Co., Ltd.). To the obtained solution was added 4.0 mL of a solution of 1.2 g of the compound (10-b)

in tetrahydrofuran, and the mixture was stirred at 50° C. for 24 hours. To the obtained solution were added 100 mL of water, 100 mL of n-hexane and 100 mL of dichloromethane, and the organic layer was separated. The obtained organic layer was washed with 100 mL of water and then dried over magnesium sulfate. The obtained solution was purified by column chromatography (filler: silica gel, eluent: toluene/ethyl acetate) to obtain 0.541 g of compound (10-c).

0.361 g of the compound (10-c) was dissolved in 5.0 mL of dimethylformamide, 0.30 g of N-bromosuccinimide (manufactured by Wako Pure Chemical Industries, Ltd.) was added thereto, and the mixture was stirred at room temperature for 24 hours under a nitrogen atmosphere. To the obtained solution were added 100 mL of water, 100 mL of n-hexane and 100 mL of dichloromethane, and the organic layer was separated. The obtained organic layer was washed with 100 mL of water and then dried over magnesium sulfate. The obtained solution was purified by column chromatography (filler: silica gel, eluent: toluene/ethyl acetate) to obtain 0.43 g of compound (10-d).

0.37 g of the compound (10-d) and 0.19 g of compound (10-e) were dissolved in 30 mL of toluene. 10 mL of water, 0.65 g of potassium carbonate, 19 mg of [1,1'-bis(diphenylphosphino)ferrocene]palladium(II) dichloride dichloromethane adduct (manufactured by Tokyo Chemical Industry Co., Ltd.) and 1 drop of Aliquat® 336 (manufactured by Aldrich) were added thereto, and the mixture was stirred at 80° C. for 1 hour under a nitrogen atmosphere. Subsequently, 0.83 g of pinacol phenylboronate was added thereto, and the mixture was stirred at 80° C. for 30 minutes. To the obtained solution was added 50 mL of methanol, and the produced solid was collected by filtration and washed with methanol, water, methanol and acetone in this order. The obtained solid was dissolved in chloroform, passed through a silica gel short column (eluent: chloroform/ethyl acetate), and then concentrated to dryness to obtain 0.20 g of compound [10]. When the molecular weight of the compound [10] was measured by the above method, the weight average molecular weight was 23560, and the number average molecular weight was 11219.

CNT dispersion liquid B (CNT composite concentration with respect to solvent: 0.03 g/l) was obtained in the same manner as in the preparation example of the CNT dispersion A except that the compound [10] was used instead of the compound [4]. The viscosity of the solvent was 3.1 cP.

Preparation Example 3 of CNT Dispersion Liquid; CNT Dispersion Liquid C

Compound [13] was synthesized by the method shown in Formula 13.

[Chemical formula 11]

Formula 13

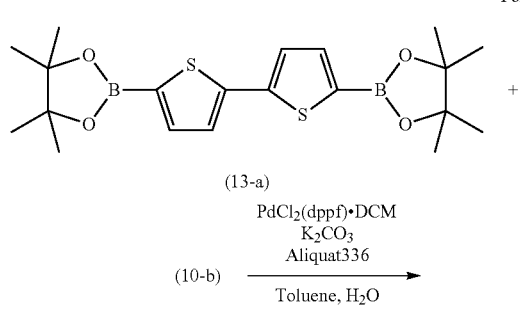

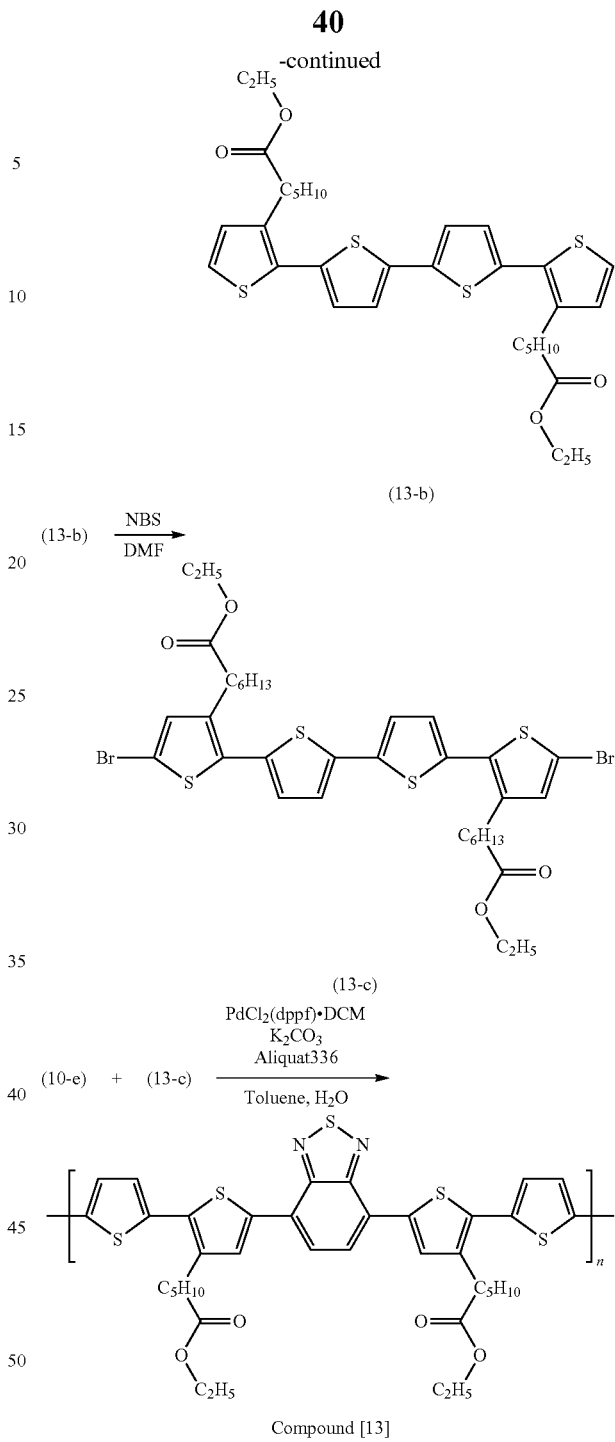

0.84 g of compound (13-a) (manufactured by Tokyo Chemical Industry Co., Ltd.) and 1.3 g of the compound (10-b) were dissolved in 100 mL of toluene. 35 mL of water, 2.6 g of potassium carbonate, 74 mg of [1,1'-bis(diphenylphosphino)ferrocene]palladium(II) dichloride dichloromethane adduct and 1 drop of Aliquat® 336 were added thereto, and the mixture was stirred at 80° C. for 1 hour under a nitrogen atmosphere. To the obtained solution were added 200 mL of water, 200 mL of n-hexane and 200 mL of dichloromethane, and the organic layer was separated. The obtained organic layer was washed with 200 mL of water and then dried over magnesium sulfate. The obtained solution was purified by column chromatography (filler: silica gel, eluent: toluene/ethyl acetate) to obtain 0.73 g of compound (13-b).

0.56 g of the compound (13-c) was obtained in the same manner as in the method for synthesizing the compound (10-d) except that 0.49 g of the compound (13-b) was used instead of the compound (10-c).

0.28 g of the compound [13] was obtained in the same manner as the method for synthesizing the compound [10] except that 0.46 g of the compound (13-c) was used instead of the compound (10-d). When the molecular weight of the compound [13] was measured by the above method, the weight average molecular weight was 18038, and the number average molecular weight was 10021.

CNT dispersion liquid C (CNT composite concentration with respect to solvent: 0.03 g/l) was obtained in the same manner as in the preparation example of the CNT dispersion A except that the compound [13] was used instead of the compound [4]. The viscosity of the solvent was 3.1 cP.

Preparation Example 4 of CNT Dispersion Liquid; CNT Dispersion Liquid D

Compound [16] was synthesized by the method shown in Formula 16.

[Chemical formula 12]

Formula 16

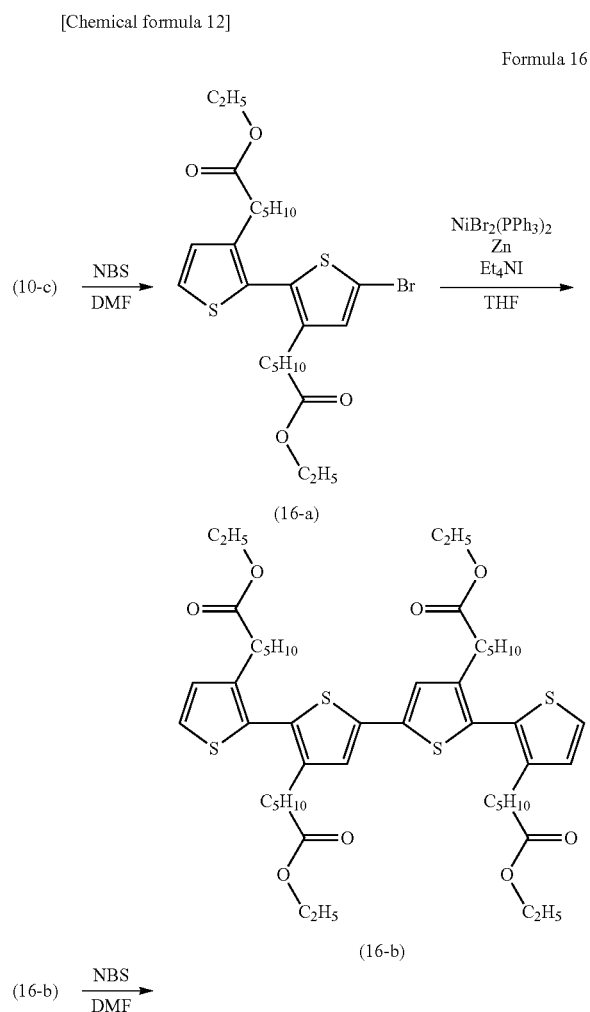

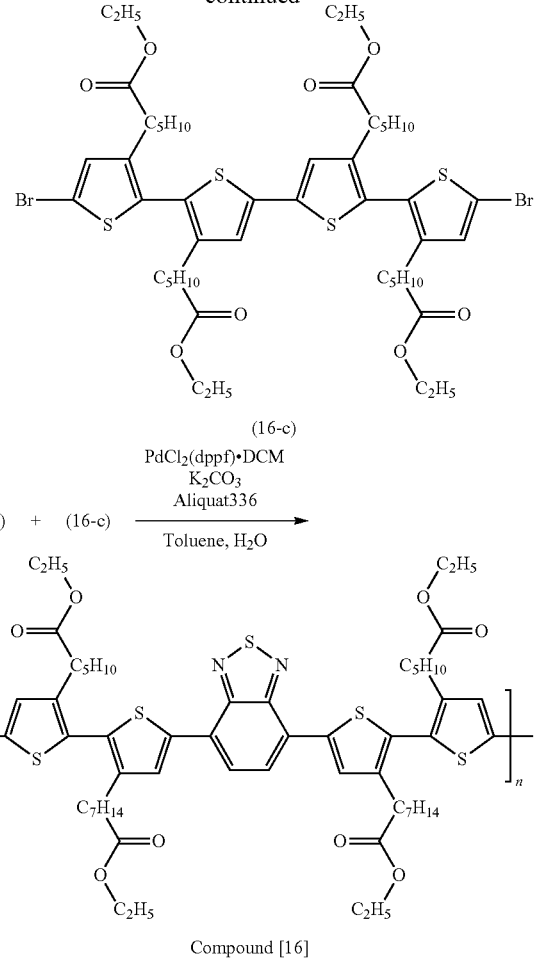

2.0 g of the compound (16-a) was obtained in the same manner as in the method for synthesizing the compound (10-b) except that 1.8 g of the compound (10-c) was used instead of the compound (10-a) and the amount of N-bromosuccinimide was 0.78 g.

0.84 g of compound (16-b) was obtained in the same manner as in the method for synthesizing the compound (10-c) except that 1.7 g of the compound (16-a) was used instead of the compound (10-b), the amount of bis(triphenylphosphine)nickel(II) bromide was 1.2 g, the amount of zinc amount was 0.16 g, and the amount of tetraethylammonium iodide was 0.82 g.

0.76 g of the compound (16-b) was obtained in the same manner as in the method for synthesizing the compound (10-d) except that 0.72 g of the compound (16-c) was used instead of the compound (10-c).

0.32 g of the compound [16] was obtained in the same manner as the method for synthesizing the compound [10] except that 0.63 g of the compound (16-c) was used instead of the compound (10-d). When the molecular weight of the compound [16] was measured by the above method, the weight average molecular weight was 18800, and the number average molecular weight was 11059.

CNT dispersion liquid D (CNT composite concentration with respect to solvent: 0.03 g/l) was obtained in the same manner as in the preparation example of the CNT dispersion A except that the compound [16] was used instead of the compound [4]. The viscosity of the solvent was 3.1 cP.

Preparation Example 5 of CNT Dispersion Liquid; CNT Dispersion Liquid E

Compound [24] was synthesized by the method shown in Formula 24.

[Chemical formula 13]

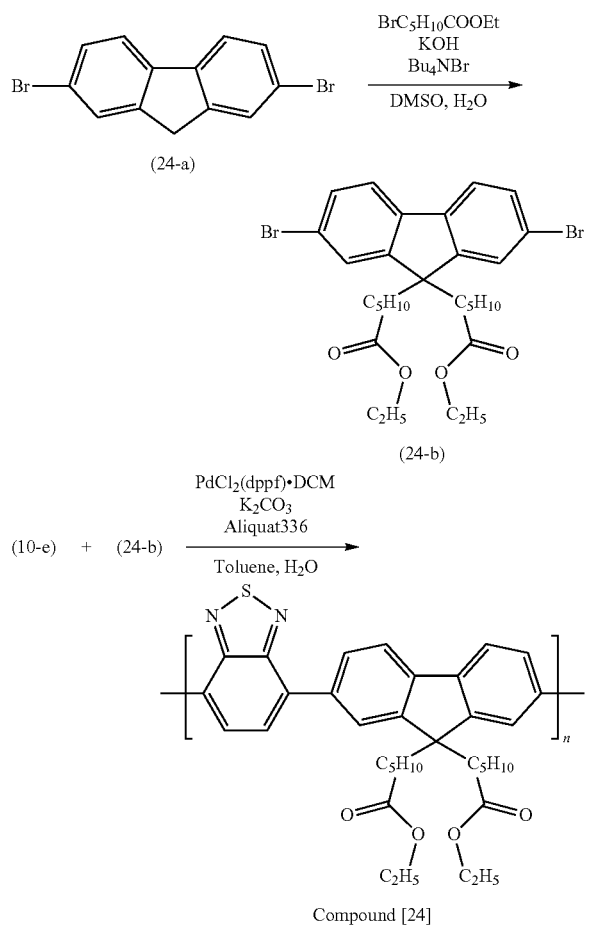

Compound [24]

1.6 g of compound (24-a) (manufactured by Tokyo Chemical Industry Co., Ltd.) and 0.32 g of tetrabutylammonium bromide (manufactured by Tokyo Chemical Industry Co., Ltd.) were dissolved in 10.0 mL of dimethyl sulfoxide (manufactured by Wako Pure Chemical Industries, Ltd.). Then, under a nitrogen atmosphere, 0.76 mL of an aqueous solution of 0.76 g of potassium hydroxide (manufactured by Wako Pure Chemical Industries, Ltd.) was added thereto, and the mixture was stirred at room temperature for 30 minutes. Ethyl 6-bromohexanoate was added to the obtained solution, and the mixture was stirred at 50° C. for 6 hours. To the obtained solution were added 100 mL of water, 100 mL of n-hexane and 100 mL of dichloromethane, and the organic layer was separated. The obtained organic layer was washed with 100 mL of water and then dried over magnesium sulfate. The obtained solution was purified by column chromatography (filler: silica gel, eluent: toluene) to obtain 1.5 g of compound (24-b).

0.19 g of the compound [24] was obtained in the same manner as the method for synthesizing the compound [10] except that 0.37 g of the compound (24-b) was used instead of the compound (10-d). When the molecular weight of the compound [24] was measured by the above method, the weight average molecular weight was 46460, and the number average molecular weight was 23230.

CNT dispersion liquid E (CNT composite concentration with respect to solvent: 0.03 g/l) was obtained in the same manner as in the preparation example of the CNT dispersion A except that the compound [24] was used instead of the compound [4]. The viscosity of the solvent was 3.1 cP.

Preparation Example 6 of CNT Dispersion Liquid; CNT Dispersion Liquid F

Compound [28] was synthesized by the method shown in Formula 28.

[Chemical formula 14]

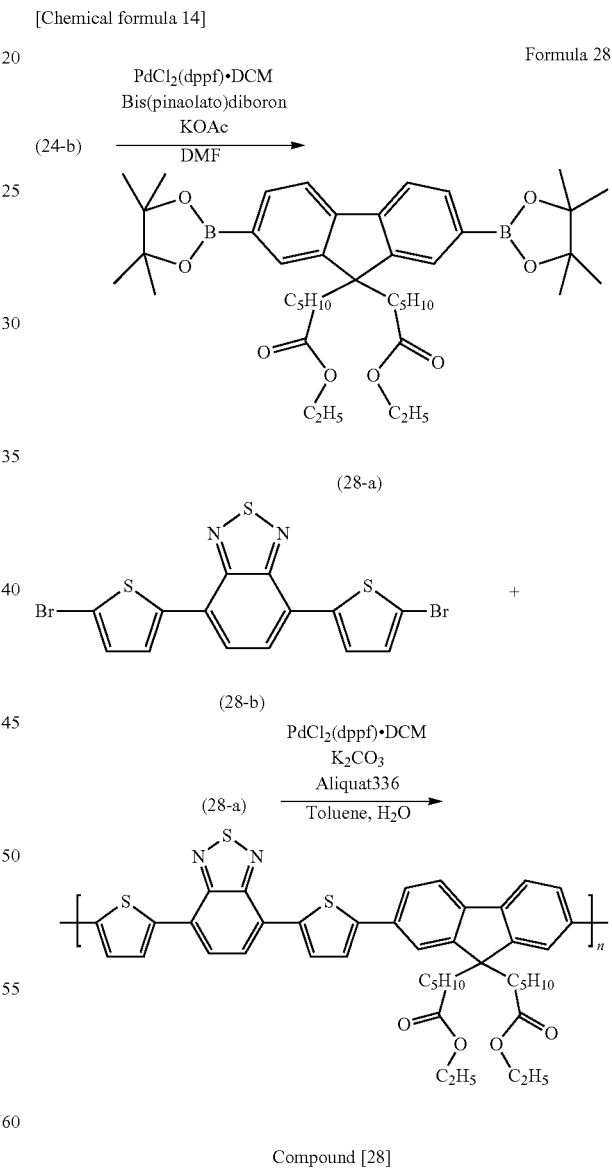

Compound [28]

1.2 g of the compound (24-b), 1.5 g of bispinacolatodiboron (manufactured by Tokyo Chemical Industry Co., Ltd.), 0.79 g of potassium acetate (manufactured by Tokyo Chemical Industry Co., Ltd.), and 74 mg of [1,1'-bis(diphenylphosphino)ferrocene]palladium(II) dichloride dichloromethane adduct were dissolved in 15.0 mL of dimethylformamide, and the mixture was stirred at 100° C. for 12 hours under a nitrogen atmosphere. To the obtained solution were added 200 mL of water, 200 mL of n-hexane and 200 mL of dichloromethane, and the organic layer was separated. The obtained organic layer was washed with 200 mL of water and then dried over magnesium sulfate. The obtained solution was purified by column chromatography (filler: silica gel, eluent: toluene/ethyl acetate) to obtain 0.84 g of compound (28-a).

0.27 g of the compound [28] was obtained in the same manner as the method for synthesizing the compound [10] except for using 0.42 g of the compound (28-a) instead of the compound (10-d), 0.23 g of the compound (28-b) instead of the compound (10-e), and 0.64 g of bromobenzene instead of pinacol phenylboronate. When the molecular weight of the compound [28] was measured by the above method, the weight average molecular weight was 20768, and the number average molecular weight was 12980.

CNT dispersion liquid F (CNT composite concentration with respect to solvent: 0.03 g/l) was obtained in the same manner as in the preparation example of the CNT dispersion A except that the compound [28] was used instead of the compound [4]. The viscosity of the solvent was 3.1 cP.

Preparation Example 7 of CNT Dispersion Liquid; CNT Dispersion Liquid G

Compound [30] was synthesized by the method shown in Formula 30.

[Chemical formula 15]

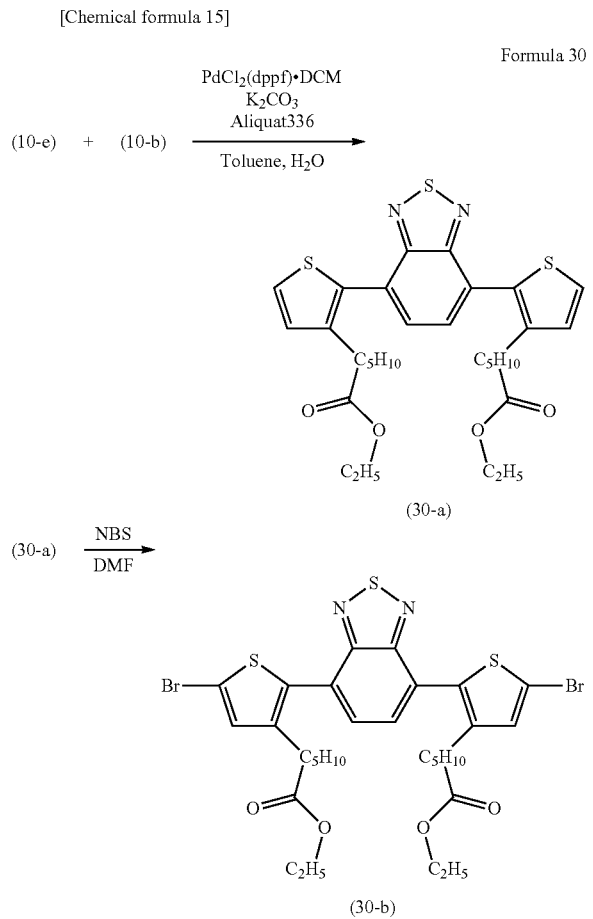

0.70 g of the compound (30-a) was obtained in the same manner as in the method for synthesizing the compound (13-b) except that 0.78 g of the compound (10-e) was used instead of the compound (13-a) and the amount of the compound (10-b) was 0.73 g.

0.50 g of the compound (30-b) was obtained in the same manner as in the method for synthesizing the compound (10-d) except that 0.47 g of the compound (30-a) was used instead of the compound (10-c).

0.41 g of the compound [30] was obtained in the same manner as the method for synthesizing the compound [28] except that 0.37 g of the compound (30-b) was used instead of the compound (28-b).

CNT dispersion liquid G (CNT composite concentration with respect to solvent: 0.03 g/l) was obtained in the same manner as in the preparation example of the CNT dispersion A except that the compound [30] was used instead of the compound [4]. The viscosity of the solvent was 3.1 cP.

Preparation Example 8 of CNT Dispersion Liquid; CNT Dispersion Liquid H

Compound [40] was synthesized by the method shown in Formula 40.

[Chemical formula 16]

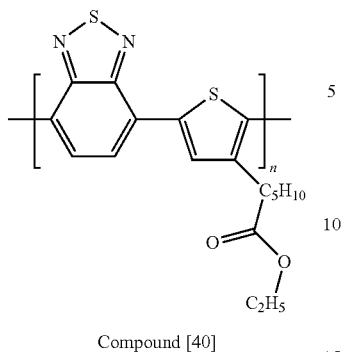

Compound [40]

0.27 g of the compound (40-a) was obtained in the same manner as in the method for synthesizing the compound (10-d) except that 0.18 g of the compound (10-a) was used instead of the compound (10-c).

0.10 g of the compound [40] was obtained in the same manner as the method for synthesizing the compound [10] except that 0.23 g of the compound (40-a) was used instead of the compound (10-d). When the molecular weight of the compound [40] was measured by the above method, the weight average molecular weight was 36343, and the number average molecular weight was 19130.

CNT dispersion liquid H (CNT composite concentration with respect to solvent: 0.03 g/l) was obtained in the same manner as in the preparation example of the CNT dispersion A except that the compound [40] was used instead of the compound [4]. The viscosity of the solvent was 3.1 cP.

Preparation Example 9 of CNT Dispersion Liquid; CNT Dispersion Liquid I

Compound [43] was synthesized by the method shown in Formula 43.

[Chemical formula 17]

Formula 43

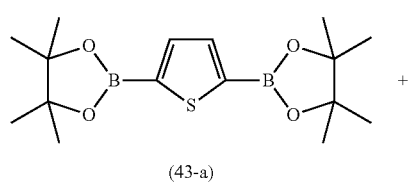

(43-a)

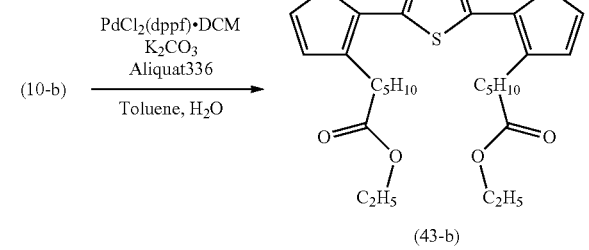

(43-b)

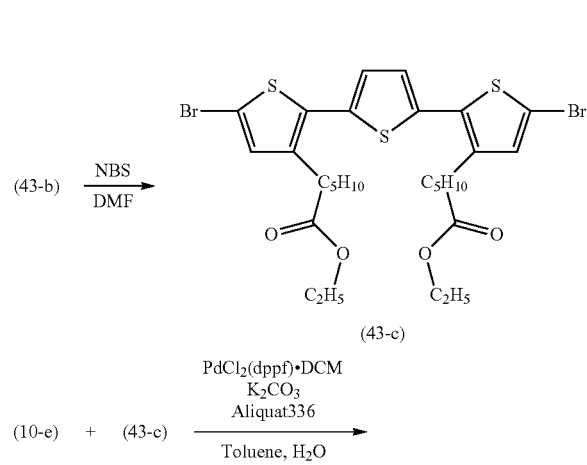

(43-c)

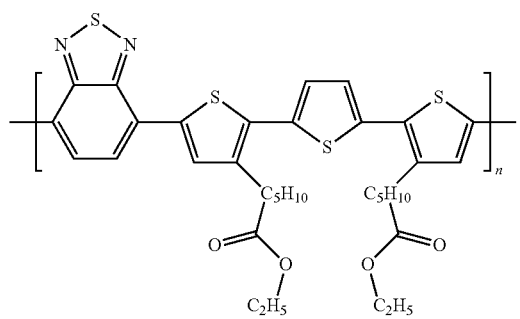

Compound [43]

0.95 g of the compound (43-b) was obtained in the same manner as in the method for synthesizing the compound (13-b) except that 0.67 g of compound (43-a) (manufactured by Tokyo Chemical Industry Co., Ltd.) was used instead of the compound (13-a).

0.50 g of the compound (43-c) was obtained in the same manner as in the method for synthesizing the compound (10-d) except that 0.43 g of the compound (43-b) was used instead of the compound (10-c).

0.25 g of the compound [43] was obtained in the same manner as the method for synthesizing the compound [10] except that 0.41 g of the compound (43-c) was used instead of the compound (10-d). When the molecular weight of the compound [43] was measured by the above method, the weight average molecular weight was 16899, and the number average molecular weight was 12230.

CNT dispersion liquid I (CNT composite concentration with respect to solvent: 0.03 g/l) was obtained in the same manner as in the preparation example of the CNT dispersion A except that the compound [43] was used instead of the compound [4]. The viscosity of the solvent was 3.1 cP.

Preparation Example 10 of CNT Dispersion Liquid; CNT Dispersion Liquid J

Compound [46] was synthesized by the method shown in Formula 46.

[Chemical formula 18]

Formula 46

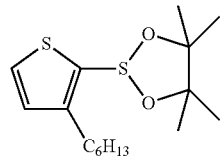

(46-a)

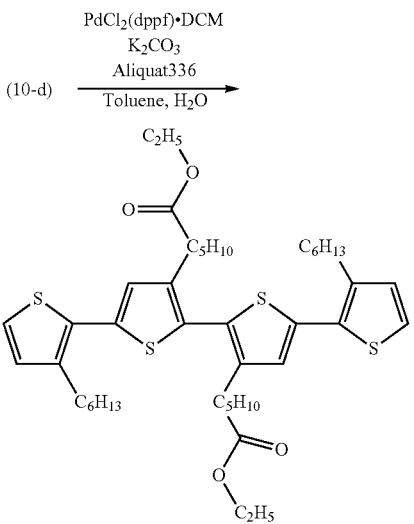

(46-b)

(46-b) →(NBS / DMF)

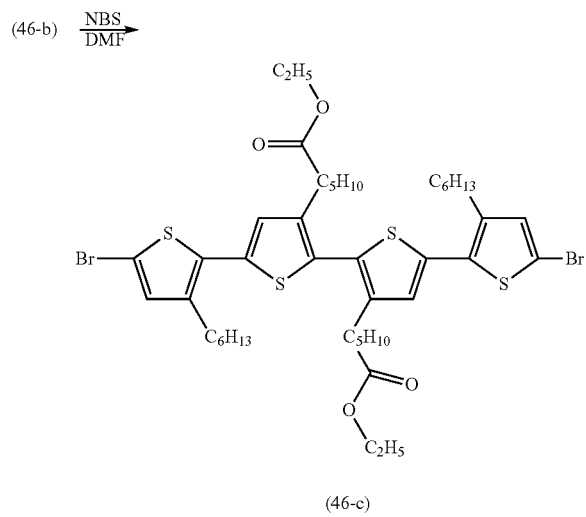

(46-c)

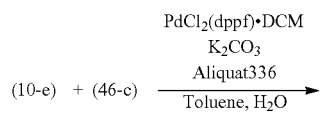

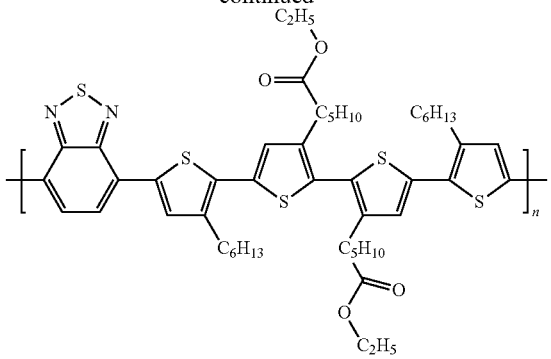

Compound [46]

1.0 g of compound (46-b) was obtained in the same manner as in the method for synthesizing the compound (13-b) except for using 1.3 g of the compound (46-a) instead of the compound (10-b) and 1.2 g of the compound (10-d) instead of the compound (13-a).

0.67 g of compound (46-c) was obtained in the same manner as in the method for synthesizing the compound (10-d) except that 0.63 g of the compound (46-b) was used instead of the compound (10-c).

0.25 g of the compound [46] was obtained in the same manner as the method for synthesizing the compound [10] except that 0.56 g of the compound (46-c) was used instead of the compound (10-d). When the molecular weight of the compound [46] was measured by the above method, the weight average molecular weight was 14042, and the number average molecular weight was 10030.

CNT dispersion liquid J (CNT composite concentration with respect to solvent: 0.03 g/l) was obtained in the same manner as in the preparation example of the CNT dispersion A except that the compound [46] was used instead of the compound [4]. The viscosity of the solvent was 3.1 cP.

Preparation Example 11 of CNT Dispersion Liquid; CNT Dispersion Liquid K

CNT dispersion liquid K (CNT composite concentration with respect to solvent: 0.03 g/l) was obtained in the same manner as in the preparation example of the CNT dispersion A except that a-tetralone was used instead of 1-chloronaphthalene. The viscosity of the solvent was 7.2 cP.

Preparation Example 12 of CNT Dispersion Liquid; CNT Dispersion Liquid L

CNT dispersion liquid L (concentration of CNT composite with respect to solvent 0.03 g/l) was obtained in the same manner as in the preparation example of the CNT dispersion A except that benzyl benzoate was used instead of 1-chloronaphthalene. The viscosity of the solvent was 8.3 cP.

Preparation Example 13 of CNT Dispersion Liquid; CNT Dispersion Liquid M

CNT dispersion liquid M (CNT composite concentration with respect to solvent: 0.03 g/l) was obtained in the same manner as in the preparation example of the CNT dispersion A except that 1-methoxynaphthalene was used instead of 1-chloronaphthalene. The viscosity of the solvent was 5.8 cP.

Preparation Example 14 of CNT Dispersion Liquid; CNT Dispersion Liquid N

CNT dispersion liquid N (concentration of CNT composite with respect to solvent 0.03 g/l) was obtained in the same manner as in the preparation example of the CNT dispersion liquid A except that dimethyl phthalate was used instead of 1-chloronaphthalene. The viscosity of the solvent was 17.2 cP.

Preparation Example 15 of CNT Dispersion Liquid; CNT Dispersion Liquid O

CNT dispersion liquid O (concentration of CNT composite with respect to solvent 0.03 g/l) was obtained in the same manner as in the preparation example of the CNT dispersion A except that ethylene glycol monophenyl ether was used instead of 1-chloronaphthalene. The viscosity of the solvent was 19.1 cP.

Preparation Example 16 of CNT Dispersion Liquid; CNT Dispersion Liquid P

CNT dispersion liquid P (CNT composite concentration with respect to solvent: 0.03 g/l) was obtained in the same manner as in the preparation example of the CNT dispersion A except that carvone was used instead of 1-chloronaphthalene. The viscosity of the solvent was 2.4 cP.

Preparation Example 17 of CNT Dispersion Liquid; CNT Dispersion Liquid Q

CNT dispersion liquid Q (CNT composite concentration with respect to solvent: 0.03 g/l) was obtained in the same manner as in the preparation example of the CNT dispersion A except that a mixed solvent of α-tetralone/o-dichlorobenzene=75% by weight/25% by weight was used instead of 1-chloronaphthalene. The viscosity of the solvent was 4.5 cP.

Preparation Example 18 of CNT Dispersion Liquid; CNT Dispersion Liquid R

CNT dispersion liquid R (CNT composite concentration with respect to solvent: 0.03 g/l) was obtained in the same manner as in the preparation example of the CNT dispersion A except that a mixed solvent of benzyl benzoate/o-dichlorobenzene=75% by weight/25% by weight was used instead of 1-chloronaphthalene. The viscosity of the solvent was 4.9 cP.

Preparation Example 19 of CNT Dispersion Liquid; CNT Dispersion Liquid S

CNT dispersion liquid S (CNT composite concentration with respect to solvent: 0.03 g/l) was obtained in the same manner as in the preparation example of the CNT dispersion A except that a mixed solvent of 1-methoxynaphthalene/o-dichlorobenzene=75% by weight/25% by weight was used instead of 1-chloronaphthalene. The viscosity of the solvent was 4.0 cP.

Preparation Example 20 of CNT Dispersion Liquid; CNT Dispersion Liquid T

CNT dispersion liquid T (CNT composite concentration with respect to solvent: 0.03 g/l) was obtained in the same manner as in the preparation example of the CNT dispersion A except that a mixed solvent of dimethyl phthalate/o-dichlorobenzene=75% by weight/25% by weight was used instead of 1-chloronaphthalene. The viscosity of the solvent was 7.8 cP.

Preparation Example 21 of CNT Dispersion Liquid; CNT Dispersion Liquid U

CNT dispersion liquid U (CNT composite concentration with respect to solvent: 0.03 g/l) was obtained in the same manner as in the preparation example of the CNT dispersion A except that a mixed solvent of ethylene glycol monophenyl ether/o-dichlorobenzene=75% by weight/25% by weight was used instead of 1-chloronaphthalene. The viscosity of the solvent was 8.5 cP.

Preparation Example 22 of CNT Dispersion Liquid; CNT Dispersion Liquid V

CNT dispersion liquid V (CNT composite concentration with respect to solvent: 0.03 g/l) was obtained in the same manner as in the preparation example of the CNT dispersion A except that a mixed solvent of phenyldiglycol/o-dichlorobenzene=75% by weight/25% by weight was used instead of 1-chloronaphthalene. The viscosity of the solvent was 12.8 cP.

Preparation Example 23 of CNT Dispersion Liquid; CNT Dispersion Liquid W

CNT dispersion liquid W (CNT composite concentration with respect to solvent: 0.03 g/l) was obtained in the same manner as in the preparation example of the CNT dispersion A except that a mixed solvent of triethylene glycol monobutyl ether/o-dichlorobenzene=75% by weight/25% by weight was used instead of 1-chloronaphthalene. The viscosity of the solvent was 6.7 cP.

Preparation Example 24 of CNT Dispersion Liquid; CNT Dispersion Liquid X

CNT dispersion liquid X (CNT composite concentration with respect to solvent: 0.03 g/l) was obtained in the same manner as in the preparation example of the CNT dispersion A except that a mixed solvent of terpineol/o-dichlorobenzene=75% by weight/25% by weight was used instead of 1-chloronaphthalene. The viscosity of the solvent was 8.9 cP.

Preparation Example 25 of CNT Dispersion Liquid; CNT Dispersion Liquid Y

CNT dispersion liquid Y (CNT composite concentration with respect to solvent: 0.03 g/l) was obtained in the same manner as in the preparation example of the CNT dispersion K except that poly-3-hexylthiophene was used instead of the compound [4]. The viscosity of the solvent was 7.2 cP.

Preparation Example 26 of CNT Dispersion Liquid; CNT Dispersion Liquid Z

CNT dispersion liquid Z (CNT composite concentration with respect to solvent: 0.03 g/l) was obtained in the same manner as in the preparation example of the CNT dispersion Y except that o-dichlorobenzene was used instead of a-tetralone. The viscosity of the solvent was 1.3 cP.

Preparation Example 27 of CNT Dispersion Liquid; CNT Dispersion Liquid AB

CNT dispersion liquid AB (CNT composite concentration with respect to solvent: 0.03 g/l) was obtained in the same manner as in the preparation example of the CNT dispersion Y except that ethyl benzoate was used instead of a-tetralone. The viscosity of the solvent was 2.2 cP.

Preparation Example 28 of CNT Dispersion Liquid; CNT Dispersion Liquid AC

CNT dispersion liquid AC (CNT composite concentration with respect to solvent: 0.03 g/l) was obtained in the same manner as in the preparation example of the CNT dispersion A except that the compound [49] was used instead of the compound [4]. The viscosity of the solvent was 3.1 cP.

Preparation Example 29 of CNT Dispersion Liquid; CNT Dispersion Liquid AD

CNT dispersion liquid AD (CNT composite concentration with respect to solvent: 0.03 g/l) was obtained in the same manner as in the preparation example of the CNT dispersion A except that the compound [1] was used instead of the compound [4]. The viscosity of the solvent was 3.1 cP.

Preparation Example 30 of CNT Dispersion Liquid; CNT Dispersion Liquid AE

CNT dispersion liquid AE (CNT composite concentration with respect to solvent: 0.03 g/l) was obtained in the same manner as in the preparation example of the CNT dispersion A except that the compound [7] was used instead of the compound [4]. The viscosity of the solvent was 3.1 cP.

Preparation Example 31 of CNT Dispersion Liquid; CNT Dispersion Liquid AF

CNT dispersion liquid AF (CNT composite concentration with respect to solvent: 0.03 g/l) was obtained in the same manner as in the preparation example of the CNT dispersion A except that the compound [5] was used instead of the compound [4]. The viscosity of the solvent was 3.1 cP.

Preparation Example 32 of CNT Dispersion Liquid; CNT Dispersion Liquid AG

CNT dispersion liquid AG (CNT composite concentration with respect to solvent: 0.03 g/l) was obtained in the same manner as in the preparation example of the CNT dispersion A except that the compound [53] was used instead of the compound [4]. The viscosity of the solvent was 3.1 cP.

Preparation Examples of Composition

Preparation Example 1 of Composition; Gate Insulating Layer Solution A 61.29 g (0.45 mol) of methyltrimethoxysilane, 12.31 g (0.05 mol) of 2-(3,4-epoxycyclohexyl)ethyltrimethoxysilane and 99.15 g (0.5 mol) of phenyltrimethoxysilane were dissolved in 203.36 g of propylene glycol monobutyl ether (boiling point 170° C.), and 54.90 g of water and 0.864 g of phosphoric acid were added thereto with stirring. The obtained solution was heated at a bath temperature of 105° C. for 2 hours to raise the internal temperature up to 90° C., thereby distilling off a component mainly composed of methanol as a by-product. Subsequently, the solution was heated at a bath temperature of 130° C. for 2.0 hours to raise the internal temperature up to 118° C., thereby distilling off a component mainly composed of water and propylene glycol monobutyl ether. Then, the mixture was cooled to room temperature to obtain a polysiloxane solution A with a solid content concentration of 26.0% by weight. When the molecular weight of the obtained polysiloxane was measured by the above method, the weight average molecular weight was 6000.

10 g of the obtained polysiloxane solution A and 13.0 g of aluminum bis(ethylacetoacetate) mono(2,4-pentanedionato) aluminum (trade name "Aluminum Chelate D", manufactured by Kawaken Fine Chemicals Co., Ltd., hereinafter referred to as Aluminum Chelate D) and 42.0 g of propylene glycol monoethyl ether acetate (hereinafter referred to as PGMEA) were mixed and stirred at room temperature for 2 hours to obtain a gate insulating layer solution A. The content of the polysiloxane in the solution was 20 parts by weight based on 100 parts by weight of Aluminum Chelate D.

Preparation Examples of Semiconductor Device

Preparation Example 1 of Semiconductor Device

The semiconductor device shown in FIG. 1 was prepared. On a glass substrate 1 (with a film thickness of 0.7 mm), chromium and gold were vacuum vapor deposited through a mask to a thickness of 5 nm and 50 nm respectively by a resistance heating method to form a gate electrode 2. Next, the substrate was spin-coated (2000 rpm×30 seconds) with the gate insulating layer solution A, and the coated substrate was heat-treated at 200° C. for one hour under a nitrogen stream to form a gate insulating layer 3 with a film thickness of 600 nm. Subsequently, gold was vacuum vapor deposited through a mask to a film thickness of 50 nm by a resistance heating method to form a source electrode 5 and a drain electrode 6. Next, a CNT dispersion liquid was coated with an inkjet coating between the source electrode 5 and the drain electrode 6 and heat-treated at 180° C. for 30 minutes under a nitrogen stream to form a semiconductor layer 4. In this way, a semiconductor device was obtained. Width (channel width) of the source and drain electrodes of this semiconductor device was set to 200 μm, and distance between the source and drain electrodes (channel length) was set to 20 μm.

EXAMPLES

Example 1

Using the CNT dispersion liquid A, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 1.0 cm$^2$/(V·s).

Example 2

Using the CNT dispersion liquid B, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 0.70 cm$^2$/(V·s).

Example 3

Using the CNT dispersion liquid C, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 0.80 cm$^2$/(V·s).

Example 4

Using the CNT dispersion liquid D, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 0.90 cm$^2$/(V·s).

Example 5

Using the CNT dispersion liquid E, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 1.1 cm$^2$/(V·s).

Example 6

Using the CNT dispersion liquid F, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 1.0 cm$^2$/(V·s).

Example 7

Using the CNT dispersion liquid G, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 0.90 cm$^2$/(V·s).

Example 8

Using the CNT dispersion liquid H, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 0.90 cm$^2$/(V·s).

Example 9

Using the CNT dispersion liquid I, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 0.70 cm$^2$/(V·s).

Example 10

Using the CNT dispersion liquid J, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 0.70 cm$^2$/(V·s).

Example 11

Using the CNT dispersion liquid K, the CNT dispersibility and the inkjet coating properties were evaluated. The CNT dispersibility was A, the inkjet coating properties were A for the satellite, and A for the coating position accuracy. Further, the semiconductor device was prepared in the same manner as in Preparation Example 1 of the semiconductor device. The mobility was 1.0 cm$^2$/(V·s).

Example 12

Using the CNT dispersion liquid L, the CNT dispersibility and the inkjet coating properties were evaluated. The CNT dispersibility was B, the inkjet coating properties were A for the satellite, and A for the coating position accuracy. Further, the semiconductor device was prepared in the same manner as in Preparation Example 1 of the semiconductor device. The mobility was 0.80 cm$^2$/(V·s).

Example 13

Using the CNT dispersion liquid M, the CNT dispersibility and the inkjet coating properties were evaluated. The CNT dispersibility was B, the inkjet coating properties were B for the satellite, and B for the coating position accuracy. Further, the semiconductor device was prepared in the same manner as in Preparation Example 1 of the semiconductor device. The mobility was 0.90 cm$^2$/(V·s).

Example 14

Using the CNT dispersion liquid N, the CNT dispersibility and the inkjet coating properties were evaluated. The CNT dispersibility was B, the inkjet coating properties were B for the satellite, and B for the coating position accuracy. Further, the semiconductor device was prepared in the same manner as in Preparation Example 1 of the semiconductor device. The mobility was 1.0 cm$^2$/(V·s).

Example 15

Using the CNT dispersion liquid O, the CNT dispersibility and the inkjet coating properties were evaluated. The CNT dispersibility was B, the inkjet coating properties were B for the satellite, and B for the coating position accuracy. Further, the semiconductor device was prepared in the same manner as in Preparation Example 1 of the semiconductor device. The mobility was 1.0 cm$^2$/(V·s).

Example 16

Using the CNT dispersion liquid P, the CNT dispersibility and the inkjet coating properties were evaluated. The CNT dispersibility was B, the inkjet coating properties were B for the satellite, and B for the coating position accuracy. Further, the semiconductor device was prepared in the same manner as in Preparation Example 1 of the semiconductor device. The mobility was 0.70 cm$^2$/(V·s).

Example 17

Using the CNT dispersion liquid Q, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 1.3 cm$^2$/(V·s).

Example 18

Using the CNT dispersion liquid R, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 1.1 cm$^2$/(V·s).

Example 19

Using the CNT dispersion liquid S, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 1.0 cm$^2$/(V·s).

Example 20

Using the CNT dispersion liquid T, the CNT dispersibility and the inkjet coating properties were evaluated. The CNT dispersibility was A, the inkjet coating properties were A for the satellite, and A for the coating position accuracy. Further, the semiconductor device was prepared in the same manner as in Preparation Example 1 of the semiconductor device. The mobility was 1.4 cm$^2$/(V·s).

Example 21

Using the CNT dispersion liquid U, the CNT dispersibility and the inkjet coating properties were evaluated. The CNT dispersibility was A, the inkjet coating properties were A for the satellite, and A for the coating position accuracy. Further, the semiconductor device was prepared in the same manner as in Preparation Example 1 of the semiconductor device. The mobility was 1.5 cm$^2$/(V·s).

Example 22

Using the CNT dispersion liquid V, the CNT dispersibility and the inkjet coating properties were evaluated. The CNT dispersibility was A, the inkjet coating properties were A for the satellite, and A for the coating position accuracy. Further, the semiconductor device was prepared in the same manner as in Preparation Example 1 of the semiconductor device. The mobility was 1.3 cm$^2$/(V·s).

Example 23

Using the CNT dispersion liquid W, the CNT dispersibility and the inkjet coating properties were evaluated. The CNT dispersibility was B, the inkjet coating properties were B for the satellite, and B for the coating position accuracy. Further, the semiconductor device was prepared in the same manner as in Preparation Example 1 of the semiconductor device. The mobility was 1.0 cm$^2$/(V·s).

Example 24

Using the CNT dispersion liquid X, the CNT dispersibility and the inkjet coating properties were evaluated. The CNT dispersibility was A, the inkjet coating properties were A for the satellite, and A for the coating position accuracy. Further, the semiconductor device was prepared in the same manner as in Preparation Example 1 of the semiconductor device. The mobility was 1.1 cm$^2$/(V·s).

Comparative Example 1

Using the CNT dispersion liquid Y, the CNT dispersibility and the inkjet coating properties were evaluated. The CNT dispersibility was D, the inkjet coating properties were A for the satellite, and A for the coating position accuracy. Further, the semiconductor device was prepared in the same manner as in Preparation Example 1 of the semiconductor device. The mobility was 0.30 cm$^2$/(V·s).

Comparative Example 2

Using the CNT dispersion liquid Z, the CNT dispersibility and the inkjet coating properties were evaluated. The CNT dispersibility was A, the inkjet coating properties were C for the satellite, and D for the coating position accuracy. Further, the semiconductor device was prepared in the same manner as in Preparation Example 1 of the semiconductor device. The mobility was 0.25 cm$^2$/(V·s).

Comparative Example 3

Using the CNT dispersion liquid AB, the CNT dispersibility and the inkjet coating properties were evaluated. The CNT dispersibility was D, the inkjet coating properties were C for the satellite, and C for the coating position accuracy. Further, the semiconductor device was prepared in the same manner as in Preparation Example 1 of the semiconductor device. The mobility was 0.28 cm$^2$/(V·s).

Example 25

Using the CNT dispersion liquid AC, the CNT dispersibility and the inkjet coating properties were evaluated. The CNT dispersibility was A, the inkjet coating properties were B for the satellite, and B for the coating position accuracy. Further, the semiconductor device was prepared in the same manner as in Preparation Example 1 of the semiconductor device. The mobility was 0.66 cm$^2$/(V·s).

Example 26

Using the CNT dispersion liquid AD, the CNT dispersibility and the inkjet coating properties were evaluated. The CNT dispersibility was C, the inkjet coating properties were B for the satellite, and B for the coating position accuracy. Further, the semiconductor device was prepared in the same manner as in Preparation Example 1 of the semiconductor device. The mobility was 0.55 cm$^2$/(V·s).

Example 27

Using the CNT dispersion liquid AE, the CNT dispersibility and the inkjet coating properties were evaluated. The CNT dispersibility was C, the inkjet coating properties were B for the satellite, and B for the coating position accuracy. Further, the semiconductor device was prepared in the same manner as in Preparation Example 1 of the semiconductor device. The mobility was 0.58 cm²/(V·s).

Example 28

Using the CNT dispersion liquid AF, the CNT dispersibility and the inkjet coating properties were evaluated. The CNT dispersibility was C, the inkjet coating properties were B for the satellite, and B for the coating position accuracy. Further, the semiconductor device was prepared in the same manner as in Preparation Example 1 of the semiconductor device. The mobility was 0.50 cm²/(V·s).

Example 29

Using the CNT dispersion liquid AG, the CNT dispersibility and the inkjet coating properties were evaluated. The CNT dispersibility was C, the inkjet coating properties were B for the satellite, and B for the coating position accuracy. Further, the semiconductor device was prepared in the same manner as in Preparation Example 1 of the semiconductor device. The mobility was 0.47 cm²/(V·s).

TABLE 1

| | CNT Dispersion liquid | Number | Side chain combined with conjugated polymer | Ratio of units having side chain represented by general formula (1) | Solvent A | Solvent B | CNT Dispersibility | Satellite | Coating position accuracy | Mobility [cm²/(V·s)] |
|---|---|---|---|---|---|---|---|---|---|---|
| Example 1 | A | 4 | Ethoxycarbonylhexyl | 1 | 1-Chloronaphthalene | None | A | B | B | 1.0 |
| Example 2 | B | 10 | Ethoxycarbonylpentyl | 0.67 | 1-Chloronaphthalene | None | A | B | B | 0.70 |
| Example 3 | C | 13 | Ethoxycarbonylpentyl Ethoxycarbonylpentyl | 0.4 | 1-Chloronaphthalene | None | A | B | B | 0.80 |
| Example 4 | D | 16 | Ethoxycarbonylheptyl | 0.8 | 1-Chloronaphthalene | None | A | B | B | 0.90 |
| Example 5 | E | 24 | Ethoxycarbonylpentyl | 0.5 | 1-Chloronaphthalene | None | A | B | B | 1.1 |
| Example 6 | F | 28 | Ethoxycarbonylpentyl | 0.25 | 1-Chloronaphthalene | None | A | B | B | 1.0 |
| Example 7 | G | 30 | Ethoxycarbonylpentyl | 0.75 | 1-Chloronaphthalene | None | A | B | B | 0.90 |
| Example 8 | H | 40 | Ethoxycarbonylpentyl | 0.5 | 1-Chloronaphthalene | None | A | B | B | 0.90 |
| Example 9 | I | 43 | Ethoxycarbonylpentyl | 0.5 | 1-Chloronaphthalene | None | A | B | B | 0.70 |
| Example 10 | J | 46 | Ethoxycarbonylpentyl Hexyl | 0.4 | 1-Chloronaphthalene | None | A | B | B | 0.70 |

TABLE 2

| | CNT Dispersion liquid | Number | Side chain combined with conjugated polymer | Ratio of units having side chain represented by general formula (1) | Solvent A | Solvent B | CNT Dispersibility | Satellite | Coating position accuracy | Mobility [cm²/(V·s)] |
|---|---|---|---|---|---|---|---|---|---|---|
| Example 11 | K | 4 | Ethoxycarbonylhexyl | 1 | α-Tetralone | None | A | A | A | 1.0 |
| Example 12 | L | 4 | Ethoxycarbonylhexyl | 1 | Benzyl benzoate | None | B | A | A | 0.80 |
| Example 13 | M | 4 | Ethoxycarbonylhexyl | 1 | 1-Methoxynaphthalene | None | B | B | B | 0.90 |
| Example 14 | N | 4 | Ethoxycarbonylhexyl | 1 | Dimethyl phthalate | None | B | B | B | 1.0 |
| Example 15 | O | 4 | Ethoxycarbonylhexyl | 1 | Ethylene glycol monophenyl ether | None | B | B | B | 1.0 |
| Example 16 | P | 4 | Ethoxycarbonylhexyl | 1 | Carvone | None | B | B | B | 0.70 |
| Example 17 | Q | 4 | Ethoxycarbonylhexyl | 1 | α-Tetralone | | | | | |
| Example 18 | R | 4 | Ethoxycarbonylhexyl | 1 | Benzyl benzoate | | | | | |
| Example 19 | S | 4 | Ethoxycarbonylhexyl | 1 | 1-Methoxynaphthalene | | | | | |
| Example 20 | T | 4 | Ethoxycarbonylhexyl | 1 | Dimethyl phthalate | | | | | |

TABLE 2-continued

| | | | | | |
|---|---|---|---|---|---|
| Example 17 | o-Olchlorobenzene | A | B | B | 1.3 |
| Example 18 | o-Olchlorobenzene | A | B | B | 1.1 |
| Example 19 | o-Olchlorobenzene | A | B | B | 1.0 |
| Example 20 | o-Olchlorobenzene | A | A | A | 1.4 |

TABLE 3

| | CNT Dispersion liquid | Conjugated polymer Number | Side chain combined with conjugated polymer | Ratio of units having side chain represented by general formula (1) | Solvent Solvent A |
|---|---|---|---|---|---|
| Example 21 | U | 4 | Ethoxycarbonylhexyl | 1 | Ethylene glycol monophenyl ether |
| Example 22 | V | 4 | Ethoxycarbonylhexyl | 1 | FhenyldIglycol |
| Example 23 | W | 4 | Ethoxycarbonylhexyl | 1 | Triethylene glycol monobutyl ether |
| Example 24 | X | 4 | Ethoxycarbonylhexyl | 1 | Terpineol |
| Comparative Example 1 | Y | | Hexyl | — | α-Tetralone |
| Comparative Example 2 | Z | | Hexyl | — | o-Dichlorobenzene |
| Comparative Example 3 | AB | | Hexyl | — | Ethyl benzoate |
| Example 25 | AC | 49 | Ethoxycarbonylpentyl Hexyl | 0.14 | 1-Chloronaphthalene |
| Example 26 | AD | 1 | Ethylcarbonylhexyl | 1 | 1-Chloronaphthalene |
| Example 27 | AE | 7 | Ethylcarbonyloxyhexyl | 1 | 1-Chloronaphthalene |
| Example 28 | AF | 5 | Phenoxycarbonylhexyl | 1 | 1-Chloronaphthalene |
| Example 29 | AG | 53 | Phenoxycarbonylpentyl | 0.5 | 1-Chloronaphthalene |

| | Solvent Solvent B | Inkjet coating properties CNT Dispersibility | Satellite | Coating position accuracy | Mobility [$cm^2/(V \cdot s)$] |
|---|---|---|---|---|---|
| Example 21 | o-Dichlorobenzene | A | A | A | 1.5 |
| Example 22 | o-Dichlorobenzene | A | A | A | 1.3 |
| Example 23 | o-Dichlorobenzene | B | B | B | 1.0 |
| Example 24 | o-Dichlorobenzene | A | A | A | 1.1 |
| Comparative Example 1 | None | D | A | A | 0.30 |
| Comparative Example 2 | None | A | C | D | 0.25 |
| Comparative Example 3 | None | D | C | C | 0.28 |
| Example 25 | None | A | B | B | 0.66 |
| Example 26 | None | C | B | B | 0.55 |
| Example 27 | None | C | B | B | 0.58 |
| Example 28 | None | C | B | B | 0.50 |
| Example 29 | None | C | B | B | 0.47 |

DESCRIPTION OF REFERENCE SIGNS

1: Substrate
2: Gate electrode
3: Gate insulating layer
4: Semiconductor layer
5: Source electrode
6: Drain electrode
7: CNT composite
8: Second insulating layer
50: Antenna

The invention claimed is:

1. A carbon nanotube composite in which a conjugated polymer is attached to at least a part of the surface of a carbon nanotube, the conjugated polymer having a side chain represented by general formula (1):

[Chemical formula 1]

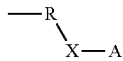

wherein
R represents an alkylene group or a cycloalkylene group,
X represents a single bond, an alkenylene group, an alkynylene group, an arylene group or a heteroarylene group, and A represents an alkylcarbonyl group, an arylcarbonyl group, a heteroarylcarbonyl group, an alkoxycarbonyl group, an aryloxycarbonyl group, a heteroaryloxycarbonyl group, an alkylcarbonyloxy group, an arylcarbonyloxy group, or a heteroarylcarbonyloxy group.

2. The carbon nanotube composite according to claim 1, wherein the A is an alkylcarbonyl group, an alkoxycarbonyl group, or an alkylcarbonyloxy group.

3. The carbon nanotube composite according to claim 1, wherein the A is an alkoxycarbonyl group.

4. The carbon nanotube composite according to claim 1, wherein the conjugated polymer contains a fluorene unit or a thiophene unit in a repeating unit.

5. The carbon nanotube composite according to claim 1, wherein, in the conjugated polymer, when a divalent group containing one of any one selected from the group consisting of an ethenylene group, an ethynylene group, an arylene group and a heteroarylene group as a divalent group contained in its main chain is one unit,
  a ratio of the number of units having a side chain represented by the general formula (1) to the number of all units of the conjugated polymer [the number of units having a side chain represented by the general formula (1)/the number of all units of the conjugated polymer] is 1/5 to 1/1.

6. A carbon nanotube dispersion liquid containing at least a carbon nanotube composite in which a conjugated polymer is attached to at least a part of the surface of a carbon nanotube, and solvent, wherein the carbon nanotube composite is the carbon nanotube composite according to claim 1.

7. A semiconductor device comprising a substrate, a source electrode, a drain electrode and a gate electrode, a semiconductor layer in contact with the source electrode and the drain electrode, and a gate insulating layer that insulates the semiconductor layer from the gate electrode, wherein the semiconductor layer contains the carbon nanotube composite according to claim 1.

8. The method for producing a semiconductor device according to claim 7, comprising a step of forming the semiconductor layer by using a coating method.

9. A wireless communication device having at least the semiconductor device according to claim 7 and an antenna.

10. A merchandise tag using the wireless communication device according to claim 9.

* * * * *